(12) United States Patent
Kubota et al.

(10) Patent No.: US 8,808,948 B2
(45) Date of Patent: Aug. 19, 2014

(54) DISPERSION COMPOSITION, PHOTOSENSITIVE RESIN COMPOSITION FOR LIGHT-SHIELDING COLOR FILTER, LIGHT-SHIELDING COLOR FILTER, METHOD OF PRODUCING THE SAME, AND SOLID-STATE IMAGE SENSOR HAVING THE COLOR FILTER

(75) Inventors: Makoto Kubota, Shizuoka-ken (JP); Yuzo Nagata, Shizuoka-ken (JP); Masaru Yoshikawa, Shizuoka-ken (JP); Yoichi Maruyama, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 542 days.

(21) Appl. No.: 12/707,677

(22) Filed: Feb. 18, 2010

(65) Prior Publication Data

US 2010/0209845 A1 Aug. 19, 2010

(30) Foreign Application Priority Data

Feb. 19, 2009 (JP) .................................. 2009-036564
Sep. 30, 2009 (JP) .................................. 2009-227992

(51) Int. Cl.
*G02B 5/20* (2006.01)

(52) U.S. Cl.
USPC .............................. 430/7; 430/270.1; 524/413

(58) Field of Classification Search
None
See application file for complete search history.

(56) References Cited

U.S. PATENT DOCUMENTS

| | | | |
|---|---|---|---|
| 2001/0045178 A1 | 11/2001 | Shirakawa et al. | |
| 2005/0258406 A1* | 11/2005 | Onishi et al. | 252/582 |
| 2008/0318018 A1 | 12/2008 | Segawa et al. | |
| 2010/0062357 A1 | 3/2010 | Ganschow et al. | |
| 2010/0243970 A1* | 9/2010 | Toshimitsu et al. | 252/582 |

FOREIGN PATENT DOCUMENTS

| | | |
|---|---|---|
| DE | 102007021867 A | 11/2008 |
| EP | 2103966 A2 | 9/2009 |
| EP | 2105792 A1 | 9/2009 |
| JP | 2001-354871 | 12/2001 |
| JP | 2002-285007 | 10/2002 |
| JP | 2004-287299 | 10/2004 |
| JP | 3724269 B2 | 12/2005 |
| JP | 2006-182627 A | 7/2006 |
| JP | 2006-206891 A | 8/2006 |
| JP | 2006-209102 A | 8/2006 |
| JP | 2007-115921 A | 5/2007 |
| JP | 2010-520340 | 6/2010 |
| WO | 2005/037926 A1 | 4/2005 |
| WO | 2008/107074 | 9/2008 |
| WO | WO 2009/025297 | * 2/2009 |

OTHER PUBLICATIONS

Corresponding Japanese Patent Office Action issued on Jul. 2, 2013 with Partial English Translation thereof.
Partial English language translation of the following: Office action dated Mar. 19, 2013 from the Japanese Patent Office in a Japanese patent application corresponding to the instant patent application. This office action translation is submitted now in order to supplement the understanding of patent document JP 2004-287299, JP2001-354871, JP2002-285007, JP2010-520340 and WO2008/107074.
Corresponding the Taiwanese Office Action issued Jun. 16, 2014, with the English Translation thereof.

* cited by examiner

*Primary Examiner* — John A. McPherson
(74) *Attorney, Agent, or Firm* — SOLARIS Intellectual Property Group, PLLC

(57) ABSTRACT

A method of producing a dispersion composition containing titanium black, a solvent and a dispersant including at least a first dispersant and a second dispersant, and the method includes dispersing a mixed liquid containing the titanium black, the first dispersant and the solvent, and adding the second dispersant to the dispersed mixed liquid and dispersing the same, wherein at least a part of the dispersant has an acid value of 50 mgKOH/g or more.

16 Claims, No Drawings

DISPERSION COMPOSITION, PHOTOSENSITIVE RESIN COMPOSITION FOR LIGHT-SHIELDING COLOR FILTER, LIGHT-SHIELDING COLOR FILTER, METHOD OF PRODUCING THE SAME, AND SOLID-STATE IMAGE SENSOR HAVING THE COLOR FILTER

CROSS-REFERENCE TO RELATED APPLICATION

This application claims priority under 35 USC 119 from Japanese Patent Application Nos. 2009-036564 filed on Feb. 19, 2009 and 2009-227992 filed on Sep. 30, 2009, the disclosures of which are incorporated by reference herein.

BACKGROUND OF THE INVENTION

Field of the Invention

The present invention relates to a dispersion composition containing titanium black and a production method thereof, a photosensitive resin composition for light-shielding color filter using the dispersion composition and a production method thereof, a light-shielding color filter and a production method thereof, and a solid-state image sensor having the light-shielding color filter.

Color filters for use in liquid crystal displays are provided with a light-shielding film called black matrix for the purpose of shielding a space between colored pixels from light, improving contrast, or the like. In addition, solid-state image sensors are also provided with a light-shielding color filter for the purpose of preventing noise, improving image quality, or the like.

As a composition used for forming a black matrix for liquid crystal display devices, or a light-shielding color filter for solid-state image sensors, a photosensitive resin composition containing a black color material such as carbon black and titanium black is known. More specifically, as photosensitive resin compositions used mainly for liquid crystal displays, a photosensitive resin composition containing titanium black having a specific X-ray diffraction peak intensity ratio (for example, Japanese Patent No. 3724269 and International Patent Publication No. WO 2005/037926), or a photosensitive resin composition containing titanium black having a specific nitrogen concentration or a specific crystallite diameter (for example, Japanese Patent Application Laid-Open (JP-A) Nos. 2006-182627, 2006-206891, and 2006-209102) have been examined for the purpose of, for example, improving the optical density.

Furthermore, as photosensitive resin compositions for solid-state image sensors, a composition for forming a light-shielding film containing titanium black and a resin component is disclosed for the purpose of obtaining a thin film with high light-shielding properties (for example, JP-A No. 2007-115921).

SUMMARY OF THE INVENTION

As described above, titanium black is known as a black pigment, and it is thought that compositions including titanium black can form high-performance light-shielding films that have excellent light-shielding properties and insulation properties However, in the compositions including titanium black fine particles, the particles are likely to aggregate over time because the density of titanium black is high. Therefore, it is difficult to use titanium black in compositions intended for application.

In recent years, particularly in the field of solid-state image sensors, the size of solid-state image sensors has been reduced and the structures of objects to which filters are to be applied have become more complicated; therefore, techniques of forming a light-shielding color filter on a substrate having a certain structure (for example, a pattern structure) are required. Furthermore, in color filters for solid-state image sensors, techniques for reducing the thickness of a color pattern (for example, to a thickness of 1 µm or less) and decreasing the size of a pixel pattern to as small as 2 µm or less (for example, to from 0.5 to 2.0 µm) are required. Therefore, techniques for reducing the thickness of light-shielding films to be applied to solid-state image sensors are also required.

The present invention has been made in view of the above-described circumstances, and aims to achieve the following.

More specifically, the present invention provides a dispersion composition having excellent dispersion stability, in which aggregation of titanium black particles is suppressed, and a method of producing the dispersion composition. The present invention also provides a photosensitive resin composition for a light-shielding color filter with which a light-shielding color filter having excellent light-shielding ability can be produced and separation of the light-shielding color filter from a substrate can be prevented even when formed on a substrate having a further structure provided thereon, and provides a method of producing the photosensitive resin composition. The present invention further provides a light-shielding color filter having excellent light-shielding ability, in which separation from a substrate is suppressed, and a method of producing the light-shielding color filter. In addition, the present invention provides a solid-state image sensor having excellent color reproducibility with reduced noise.

Aspects of the invention include those described below.

<1> A method of producing a dispersion composition containing titanium black, a solvent and a dispersant including at least a first dispersant and a second dispersant, the method including:

dispersing a mixed liquid containing the titanium black, the first dispersant and the solvent; and adding the second dispersant to the dispersed mixed liquid and dispersing the same, wherein at least a part of the dispersant has an acid value of 50 mgKOH/g or more.

<2> The method of producing a dispersion composition according to <1>, wherein a ratio (D/P) (mass ratio) of a total amount of the dispersant (D) to an amount of the titanium black (P) is from 0.2 to 1.2.

<3> The method of producing a dispersion composition according to <1> or <2>, wherein at least a part of the dispersant is a graft copolymer including a graft chain having a total number of atoms, other than hydrogen atoms, of from 40 to 10,000.

<4> A dispersion composition produced according to the method of any one of <1> to <3>.

<5> A method of producing a photosensitive resin composition for a light-shielding color filter containing titanium black, a resin, a polymerizable compound, a photopolymerization initiator, a solvent and a dispersant including at least a first dispersant and a second dispersant, method including:

dispersing a mixed liquid containing the titanium black, the first dispersant and the solvent; and adding the second dispersant to the dispersed mixed liquid and dispersing the same, wherein at least a part of the dispersant has an acid value of 50 mgKOH/g or more.

<6> The method of producing a photosensitive resin composition for a light-shielding color filter according to <5>, wherein a ratio (D/P) (mass ratio) of a total amount of the dispersant (D) to an amount of the titanium black (P) is from 0.2 to 1.2.

<7> The method of producing a photosensitive resin composition for a light-shielding color filter according to <5> or <6>, wherein at least a part of the dispersant is a graft copolymer including a graft chain having a total number of atoms, other than hydrogen atoms, of from 40 to 10,000.

<8> A photosensitive resin composition for a light-shielding color filter produced according to method of any one of <5> to <7>.

<9> A method of using the photosensitive resin composition for a light-shielding color filter according to <8>, the method comprising producing a color filter for a solid-state image sensor, wherein the color filter includes the photosensitive resin composition.

<10> A method of producing a light-shielding color filter, the method including:

forming a photosensitive layer by applying the photosensitive resin composition for a light-shielding color filter according to <8> onto a substrate;

exposing the photosensitive layer patter-wise; and forming a color pattern by developing the photosensitive layer.

<11> A light-shielding color filter obtained according to the method of <10>.

<12> A solid-state image sensor, having the light-shielding color filter according to <11>.

DETAILED DESCRIPTION OF THE INVENTION

Hereinafter, a dispersion composition of the present invention and a production method thereof is described in detail. Furthermore, a photosensitive resin composition for a light-shielding color filter using the dispersion composition of the invention and a production method thereof, a light-shielding color filter and a production method thereof, and a solid-state image sensor having the light-shielding color filter is described in detail.

Dispersion Composition and Production Method Thereof

In the present invention, a method of producing the dispersion composition containing titanium black, a solvent and a dispersant including at least a first dispersant and a second dispersant includes dispersing the mixed liquid containing titanium black, the first dispersant and the solvent (hereinafter sometimes referred to as a "first stage of dispersion treatment"), and adding the second dispersant to the dispersed mixed liquid and dispersing the same (hereinafter sometimes referred to as a "second stage of dispersion treatment"), in which at least a part of the dispersant has an acid value of 50 mgKOH/g or more. Here, a dispersion method including the first and second stages of dispersion treatment is sometimes referred to as a "multistage dispersion treatment". The multistage dispersion treatment also includes an embodiment in which a third or subsequent stages of dispersion treatment are further conducted by adding a dispersant after the second stage of dispersion treatment.

The dispersion composition of the present invention can be produced according to the method described above.

In the present invention, instead of conducting dispersion by adding the whole amount of all the dispersant collectively regardless of the degree of dispersion, multistage dispersion treatment is performed. In the multistage dispersion treatment, titanium black is dispersed while adding dispersant in stages while considering the state of dispersion of the titanium black. For example, at the beginning of the dispersion treatment, adding dispersant to the mixed liquid increases the viscosity and decreases the particle diameter. Therefore, the dispersant is added while considering the timing at which the viscosity increases and the particle diameter decreases as the dispersion progresses, in order to effectively suppress aggregation, which easily occurs in a fine dispersion treatment, and to increase the effect of improving dispersibility resulting from the addition of dispersant. Moreover, by using a dispersant having a high acid value, that is, a dispersant having a high acid value of 50 mgKOH/g or more, as a part or all of the dispersant added in stages, an effect of stabilizing the dispersion of titanium black caused by the dispersant is improved, and thus aggregation of titanium black can be effectively prevented. Accordingly, in the present invention, a dispersion composition having superior dispersion stability compared with one formed by a conventional dispersion treatment can be obtained.

The "multistage dispersion treatment" in the invention refers to a dispersion treatment in which the ratio (D/P ratio) of an amount of a dispersant (D) to an amount of the titanium black (P) increases with every stage of the first, second and/or later stages of dispersion treatment. Dispersion treatment in which the D/P ratio does not increase with every stage of the dispersion treatment is not included in the multistage dispersion treatment of the present invention. For example, a dispersion treatment in which a dispersion treatment is suspended at some point and, after some time, dispersion treatment is simply re-started at the same D/P ratio, or a dispersion treatment in which multiple dispersion treatment is conducted by changing the disperser, the type or amount of beads or the like without changing the D/P ratio, is not included in the multistage dispersion treatment of the present invention.

In the method of producing a dispersion composition of the present invention, a dispersant having an acid value of 50 mgKOH/g or more may be used in any one of the stages of the multistage dispersion treatment. The dispersant having an acid value of 50 mgKOH/g or more is not necessarily used in all of the stages of the multistage dispersion treatment. In order to improve effects of preventing titanium black aggregation and to obtain more excellent dispersion stability, the dispersant having an acid value of 50 mgKOH/g or more is preferably used in two or more stages of the multistage dispersion treatment, and more preferably used in all of the stages of the multistage dispersion treatment.

First Stage of Dispersion Treatment

The first stage of dispersion treatment is dispersion treatment in which a mixed liquid containing titanium black, a first dispersant and a solvent is dispersed.

In the first stage of dispersion treatment, titanium black is dispersed using, as the first dispersant, a part of dispersant to be used of the invention. In the first stage of dispersion treatment, it is preferable to use a dispersant having an acid value of 50 mgKOH/g or more as the first dispersant. However, when a dispersant having an acid value of 50 mgKOH/g or more is used in the second and/or later stage of dispersion treatment described below, the first stage of dispersion treatment may be performed using a dispersant having an acid value lower than 50 mgKOH/g.

In the first stage of dispersion treatment, the ratio (D/P ratio) (mass ratio) of an amount of the first dispersant (D) to an amount of the titanium black (P) in the mixed liquid is preferably from 0.05 to 1.00, and more preferably from 0.05 to 0.50. When the D/P ratio is adjusted so as not to be excessively high, for example, to 1.00 or lower, the process of dispersion can be accelerated. When the D/P ratio is adjusted to 0.05 or more, the dispersion stability can be improved.

In the first stage of dispersion treatment, in order to suppress the aggregation of particles and to improve dispersion stability of a final dispersion liquid, the viscosity (at 25° C.) of a dispersion liquid after the dispersion treatment is preferably in the range of from 1 mPa·s to 100 mPa·s, and more preferably in the range of from 1 mPa·s to 50 mPa·s. The viscosity is measured by measuring a viscosity of a dispersion liquid at 25° C. by a viscometer RE-85 (trade name, manufactured by Toki Sangyo Co., Ltd.).

The timing of terminating the first stage of dispersion treatment and adding a second dispersant can be determined based on whether or not the viscosity (at 25° C.) of the dispersion liquid has reached the above range.

In the first stage of dispersion treatment, the volume average particle diameter of titanium black after the dispersion treatment is preferably in the range of from 0.005 µm to 0.03 µm, and more preferably in the range of from 0.01 µm to 0.02 µm. The volume average particle diameter of titanium black is determined by a dynamic light scattering method using a diluent obtained by diluting a mixed liquid or a dispersion liquid containing titanium black 80-fold with propylene glycol monomethyl ether acetate. The measurement can be performed using MICROTRAC UPA-EX150 (trade name, manufactured by Nikkiso Co., Ltd.).

A dispersion device for use in the dispersion treatment is not particularly limited, and, for example, dispersion devices capable of repeatedly performing dispersion treatment of a mixed liquid, such as circulating type dispersion devices, can be used. Specific examples of the dispersion device include ULTRA APEX MILL (trade name, manufactured by Kotobuki Industries Co., Ltd.) and DYNO-MILL ECM series (trade name, available from Shinmaru Enterprises Corporation).

A temperature for the dispersion treatment is not particularly limited, and is preferably from 5° C. to 60° C. and more preferably 20° C. to 40° C., in view of dispersion stability.

The dispersion treatment is preferably performed using beads. The composition or size (diameter) of the beads is not particularly limited, and beads with known composition or diameter can be used. For example, the diameter of beads is preferably from 0.01 mm to 0.10 mm.

The mass ratio of the solvent to the titanium black (solvent/titanium black) of the mixed liquid in the first stage of dispersion treatment is preferably from 1.0 to 9.0 and more preferably from 1.0 to 5.0, in view of dispersibility.

The details of each of the components such as titanium black, the dispersant and the solvent in the mixed liquid to be dispersed are described below. In addition to titanium black, the dispersant, and the solvent, the mixed liquid may contain a component for a photosensitive resin composition described below (for example, a resin, a photopolymerization initiator, a polymerizable compound, or the like).

Second Stage of Dispersion Treatment

The second stage of dispersion treatment is dispersion treatment in which a second dispersant is added to the mixed liquid obtained by the first stage of dispersion treatment and then the resultant is dispersed.

In the second stage of dispersion treatment, a part or all of the remainder of the initial dispersant (that is, the amount obtained by subtracting the amount of the dispersant used in the first stage of dispersion treatment from the total amount of the initial dispersant) is used to further disperse titanium black. The second dispersant used in the second stage of dispersion treatment may be the same as or may be different from the first dispersant used in the first stage of dispersion treatment. In the second stage of dispersion treatment, it is preferable to use a dispersant having an acid value of 50 mgKOH/g or more as the second dispersant. However, when a dispersant having an acid value of 50 mgKOH/g or more is used in the first and/or third or subsequent stages of dispersion treatment, the second stage of dispersion treatment may be performed using a dispersant having an acid value lower than 50 mgKOH/g.

In the second stage of dispersion treatment, the mass ratio (D/P ratio) of an amount of the second dispersant (D) to an amount of the titanium black (P) in the mixed liquid is preferably from 0.05 to 1.00 and more preferably from 0.05 to 0.50. When the D/P ratio is adjusted so as not to be excessively high, for example, to 1.00 or lower, the process of dispersion can be accelerated. When the D/P ratio is adjusted to 0.05 or more, the dispersion stability can be improved.

The timing of adding the second dispersant in the second stage of dispersion treatment is not particularly limited. In terms of dispersibility-improving effect (that is, the effect of preventing the titanium black aggregation) obtained by adding dispersant in several batches, the second dispersant is preferably added after the amount of change of the viscosity (at 25° C.) of the dispersion liquid reaches 0.2 mPa·s/pass or more, and more preferably 3.8 mPa·s/pass or more. In the second stage of dispersion treatment, the dispersant may be added only once or may be added in two or more batches. The timing of subsequent additions can be delayed after the amount of change of the viscosity reaches 3.8 mPa·s/pass or more.

In the second stage of dispersion treatment, it is also preferable to add the second dispersant after the volume average particle diameter of titanium black reaches 10 nm/pass or lower based on the same reason as described above. In this case, the second dispersant may be added only once or may be added in two or more batches in the second stage of dispersion treatment. Interval between the addition timing can be extended after the amount of change of the volume average particle diameter reaches 10 nm/pass or lower.

Here, the states of "0.2 mPa·s/pass or more" and "10 nm/pass or lower" indicate that the changes in the viscosity and the volume average particle diameter per pass in a dispersion device are 0.2 mPa·s or more and 10 nm or lower, respectively. Examples of the states of "0.2 mPa·s/pass or more" and "10 nm/pass or lower" include the following states.

More specifically, in a system in which the viscosity and the volume average particle diameter change with respect to each pass at the beginning of the dispersion treatment of the mixed liquid, and the viscosity increases and the change in the volume average particle diameter decreases with respect to each pass as the dispersion progresses, a state in which the amount of change of the viscosity or the volume average particle diameter with respect to each pass reaches 0.2 mPa·s or more or 10 nm or lower is indicated by "0.2 mPa·s or more" or "10 nm or lower".

Here, the "pass" refers to the time taken for the whole amount of a dispersion liquid passes a dispersion device. For example, when 25 L (liter) of a mixed liquid is dispersed at a flow rate of 5 L/h in a dispersion device, 5 hour's dispersion treatment is defined as "one pass". The number of passes is determined by the following Equation (A).

$$\text{Number of passes} = (\text{Flow rate } (L/h) \times \text{Treatment time } (h))/\text{Amount of treatment liquid } (L) \quad \text{Equation (A)}$$

In the second stage of dispersion treatment, a solvent may be added to the second dispersant. The solvent to be added may be the same as or may be different from the solvent included in the mixed liquid used in the first stage of dispersion treatment. In the second stage of dispersion treatment, a component for a photosensitive resin composition described below (for example, a resin, a photopolymerization initiator, a polymerizable compound, or the like) may be added in addition to the second dispersant and the solvent.

Preferable dispersion conditions (devices, temperatures, or the like) of the second stage of dispersion treatment are the same as that of the first stage of dispersion treatment. The dispersion condition of the first stage of dispersion treatment may be the same as or different from the dispersion condition of the second stage of dispersion treatment.

The dispersion composition (hereinafter sometimes referred to as a "final dispersion composition") of the invention is prepared through the first and second stages of dispersion treatment (and, if necessary, the third stage of dispersion treatment, the third and subsequent stages of dispersion treatment, or another treatment).

The total content of a solvent in the obtained final dispersion composition is preferably from 30% by mass to 95% by mass, more preferably from 40% by mass to 90% by mass, and still more preferably from 50% by mass to 80% by mass, with respect to the total mass of the final dispersion composition.

The ratio (D/P ratio) of an total amount of the dispersant (the dispersant including at least the first and second dispersants) (D) to an amount of the titanium black (P) in the obtained final dispersion composition is preferably from 0.2 to 1.2. When the D/P ratio is 0.2 or more, dispersion stability is improved. A D/P ratio of 1.2 or lower is preferable in terms of finely particulating a pigment over the course of the dispersion. More specifically, the D/P ratio is more preferably from 0.2 to 0.8, and still more preferably from 0.2 to 0.5, based on the same reason as described above.

The content of the titanium black in the obtained final dispersion composition is preferably from 5% by mass to 80% by mass, more preferably from 5% by mass to 50% by mass, and still more preferably from 5% by mass to 30% by mass, with respect to the total mass of the final dispersion composition.

Hereinafter, each of the components such as the titanium black, the dispersant and the solvent in the dispersion composition of the invention, and the method of producing the dispersion composition is described in detail.

Titanium Black

The titanium black in the invention is a black particle (black pigment) containing a titanium atom. The titanium black is preferably a lower titanium oxide or a titanium oxynitride represented by $TiN_xO_y$, (x and y each independently represent the real number lower than 2).

If necessary, the surface of the titanium black can be treated for the purposes of improving dispersibility, preventing aggregation, or the like. Specifically, titanium black can be covered with silicon oxide, titanium oxide, germanium oxide, aluminum oxide, magnesium oxide, or zirconium oxide, or can be treated with a water-repellent substance such as those disclosed in JP-A No. 2007-302836.

Examples of methods of preparing the titanium black include, but not limited thereto, a method in which a mixture of titanium dioxide and metal titanium is reduced by heating it in a reductive atmosphere (for example, a method described in JP-A No. 49-5432); a method in which ultra fine titanium dioxide obtained by high-temperature hydrolysis of titanium tetrachloride is reduced in a reductive atmosphere containing hydrogen (for example, a method described in JP-A No. 57-205322); a method in which titanium dioxide or titanium hydroxide is reduced at high temperature in the presence of ammonia (for example, a method described in JP-A No. 60-65069 or JP-A No. 61-201610); and a method in which a vanadium compound is attached to titanium dioxide or titanium hydroxide, and then the resultant is reduced at high temperature in the presence of ammonia (for example, a method described in JP-A No. 61-201610).

The average primary particle diameter of the titanium black is not particularly limited, and is preferably from 3 nm to 2000 nm, more preferably from 10 nm to 500 nm, and still more preferably from 10 nm to 100 nm, in view of dispersibility and coloring properties.

The specific surface area of the titanium black is not particularly limited. In order to obtain the titanium black that can achieve a given level of water-repellent performance after surface treatment with a water-repellent agent, the specific surface area measured by the BET method is generally from about 5 $m^2/g$ to 150 $m^2/g$ and preferably from 20 $m^2/g$ to 100 $m^2/g$.

Examples of commercially available titanium black include TITANIUM BLACK 10S, 12S, 13R, 13M, 13M-C, 13R, 13R-N, and 13M-T (trade names, available from MITSUBISHI MATERIALS CORP., manufactured by Jemco Co., Ltd.) and TILACK D (trade name, manufactured by Akokasei Co., Ltd.).

The titanium black may be used singly or in combination of two or more kinds thereof.

If necessary, an extender pigment may be added to the titanium black. Examples of the extender pigment include barium sulfate, barium carbonate, calcium carbonate, silica, basic magnesium carbonate, alumina white, gross white, titanium white and hydrotalcite. The extender pigment may be used singly or as a mixture of two or more kinds thereof. The amount of the extender pigment to be used is generally from 0 to 100 parts by mass, preferably from 5 parts by mass to 50 parts by mass, and more preferably from 10 parts by mass to 40 parts by mass, with respect to 100 parts by mass of the titanium black. If necessary, the surface of the titanium black and the extender pigment may be modified with a polymer.

The dispersion composition of the invention may contain a light-shielding pigment other than the titanium black. Examples of the light-shielding pigment are not particularly limited as long as the light-shielding pigment has a absorption wavelength in the visible region. Examples of the light-shielding pigment include the above-described extender pigment, carbon black, and organic pigment such as C.I. Pigment Blue 1, 2, 15, 15:1, 15:2, 15:3, 15:4, 15:6, 16, 22, 60, 64, 66, 79, and 80, C.I. Pigment Violet 1, 19, 23, 27, 32, 37, and 42, C.I. Pigment Brown 25 and 28 or C.I. Pigment Black 1 and 7. Examples of a combination of the titanium black and the light-shielding pigment other than titanium black include: a combination of titanium black and carbon black at a ratio of 6:1, and a combination of titanium black and titanium oxide at a ratio of 3:1. The content of the light-shielding pigment used in combination with the titanium black is generally in the range of from 0.01 parts by mass to 99.99 parts by mass, and preferably in the range of from 20 parts by mass to 70 parts by mass, with respect to 100 parts by mass of the titanium black.

Dispersant

In the invention, the dispersant (for example, the dispersant including at least the first dispersant and the second dispersant) is used in the dispersion treatment. The first dispersant and the second dispersant are used in the first stage and second stage of the dispersion treatment, respectively. If necessary, the dispersant may further contain a third or more dispersants when third and later stages of dispersion treatment are performed. At least a part of the dispersant has an acid value of 50 mgKOH/g or more. As the dispersant, a single type of dispersant may be used in each step of the multistage dispersion treatment, or a different type of dispersant may be used in respective steps of the multistage dispersion treatment. In each stage of the multistage dispersion treatment, only one type of dispersant may be used or two or more types of dispersants may be used.

The dispersant used in the invention preferably has a higher acid value. When the acid value is high, titanium black having a nitrogen atom can be efficiently dispersed. In general, in order to adjust the acid value so as not to be excessively high in order to suppress the interaction among the dispersant, and in order to increase dispersibility, the acid value of the dispersant is preferably from 20 mgKOH/g to 300 mgKOH/g. However, in the present invention, in order to prevent aggregation of the titanium black more effectively and to increase dispersibility remarkably, a dispersant having an acid value of 50 mgKOH/g or more is used for a part or all of the dispersant.

When the dispersant having the acid value of 50 mgKOH/g or more is used, the dispersant easy to adsorb onto the surface of the titanium black (and the pigment to be used in combination, if necessary) and may function to prevent re-aggregation. Therefore, when the dispersant having the acid value of lower than 50 mgKOH/g is used, effects of preventing the aggregation of the titanium black decreases and more excellent dispersion stability compared with the conventional cases cannot be obtained.

In particular, based on the same reason as above, it is preferable using a dispersant having an acid value of from 50 mgKOH/g to 275 mgKOH/g, it is more preferable using a dispersant having an acid value of from 60 mgKOH/g to 250 mgKOH/g, and it is still more preferable using a dispersant having more preferably has an acid value of from 70 mgKOH/g to 200 mgKOH/g.

In the present invention, it is preferable that at least a part of the dispersant has an acid value of from 50 mgKOH/g to 300 mgKOH/g, and it is preferable that the D/P ratio of the final dispersion composition is from 0.2 to 0.8 (more preferably, from 0.2 to 0.5).

Furthermore, at least a part of the dispersant of the present invention preferably has an acidic polar group, since such dispersant exhibits favorable adsorbability to titanium black and improves the dispersibility and also functions as a resin capable of being developed for forming a pattern by alkaline development. It is preferable that at least a part of the dispersant has 10 mol or more of an acidic polar group, with respect to 1 mol of the dispersant. Examples of the acidic polar group include a carboxyl group, a sulfonic acid group, a phosphate group, and a phenolic hydroxyl group. Preferable examples thereof include a dispersant resin into which an alkali soluble partial structure, such as a carboxylic acid group, has been introduced. The content of the acidic polar group in the dispersant is more preferably 30 mol or more, with respect to 1 mol of the dispersant.

In the dispersion composition of the present invention, it is preferable to use a dispersant into which the alkali soluble partial structure has been introduced, in that alkali solubility is also given to the dispersant, which is indispensable to disperse titanium black in a photosensitive resin composition for a light-shielding color filter using the dispersion composition of the invention described below, and that the alkaline developability of an unexposed portion can be improved in the pattern formation using the photosensitive resin composition.

The acid value of the dispersant is calculated from the average content of the acidic group in the dispersant. The acid value of the dispersant can be adjusted to a desired acid value by changing the content ratio of structural units derived from acidic group-containing monomers constituting the dispersant.

The polymer structure of the dispersant is not particularly limited and examples thereof include a liner polymer, a graft polymer, a polymer having an acidic group at the terminal(s) of a liner polymer, a polymer having an acidic group at the terminal(s) of a graft polymer, a star polymer, and a block polymer. Among these structures, a graft polymer is preferable from the viewpoint of dispersion stability.

The main chain structure of the graft polymer is not particularly limited and examples thereof include a poly(meth)acrylic structure, a polyester structure, a polyurethane structure, and a polyurea structure. From the viewpoint of ease of synthesis, the poly(meth)acrylic structure is preferable.

Examples of the graft polymer include a graft copolymer.

The graft copolymer preferably contains a graft chain having a total number of atoms, other than hydrogen atoms, of from 40 to 10,000. Here, the graft moiety indicates a chain from the bottom of the main chain of the copolymer to the terminal of a group branched from the main chain.

In the dispersion composition of the present invention, the graft copolymer acts as a dispersant resin that gives dispersibility to titanium black. Therefore, the dispersion composition has excellent dispersibility for titanium black and dispersion stability over time due to excellent dispersibility and due to excellent compatibility of the graft chain of the graft copolymer with a solvent. Since the graft chain of the graft copolymer exhibits compatibility with a polymerizable compound, other resins that can be used in combination, or the like, residues are difficult to produce in alkaline development when the dispersion composition is used for forming a photosensitive resin composition.

When the graft chain is long, steric repulsion effects can be increased and dispersibility can be improved. In contrast, when the graft chain is excessively long, the adsorbability to titanium black decreases and dispersibility is reduced. Therefore, in the graft copolymer used in the invention, the total number of atoms, other than hydrogen atoms, per graft chain is preferably from 40 to 10,000, more preferably from 50 to 2,000, and still more preferably from 60 to 500.

Examples of the polymer structure of the graft chain include poly(meth)acryl, polyester, polyurethane, polyurea, polyamide, and polyether. In order to improve the interaction between the graft moiety and a solvent and to improve dispersibility, a graft chain having a poly(meth)acrylic structure, poly(meth)acryl, polyester, or polyether is preferable, and a graft chain having polyester or polyether is more preferable.

The structure of a macromonomer having the above-described polymer structure in the graft chain is not particularly limited as long as it has a substituent that can be reacted with a polymer main chain and satisfies the requirements of the present invention. It is preferable to use a macromonomer having a reactive double bond.

Examples of commercially available macromonomers preferably used for synthesis of the graft copolymer include AA-6, AA-10, AB-6, AS-6, AN-6, AW-6, AA-714, AY-707, AY-714, AK-5, AK-30, AK-32 (all trade names, manufactured by TOAGOSEI Co., Ltd.), BLEMMER PP-100, PP-500, PP-800, PP-1000, 55-PET-800, PME-4000, PSE-400, PSE-1300, and 43-PAPE-600B (all trade names, manufactured by NOF CORPORATION). Among the above, AA-6, AA-10, AB-6, AS-6 and AN-6 (all trade names, manufactured by TOAGOSEI Co., Ltd.), and BLEMMER PME-4000 (trade name, manufactured by NOF CORPORATION) are preferable.

The graft moiety in the graft copolymer of the present invention preferably contains at least one of structural units represented by the following Formulae (1) to (5).

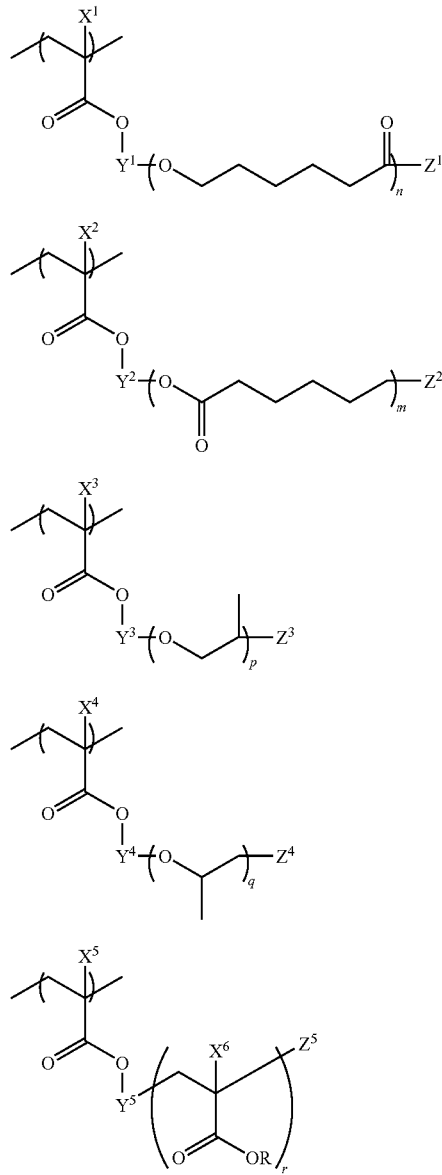

In Formulae (1) to (5), $X^1$, $X^2$, $X^3$, $X^4$, $X^5$, and $X^6$ each independently represent a hydrogen atom or a monovalent organic group. In consideration of synthetic limitations, it is preferable that $X^1$, $X^2$, $X^3$, $X^4$, $X^5$, and $X^6$ each independently represent a hydrogen atom or an alkyl group having 1 to 12 carbon atoms; it is more preferable that $X^1$, $X^2$, $X^3$, $X^4$, $X^5$, and $X^6$ each independently represent a hydrogen atom or a methyl group; and it is still more preferable that $X^1$, $X^2$, $X^3$, $X^4$, $X^5$, and $X^6$ each represent a methyl group.

In Formulae (1) to (5), $Y^1$, $Y^2$, $Y^3$, $Y^4$, and $Y^5$ each independently represent a divalent linking group, and the structure thereof is not particularly limited. Specific examples of the divalent linking group include linking groups (Y-1) to (Y-20) shown below. In the following formulae, A and B represent bonding positions at the left and right terminal groups of Formulae (1) to (5), respectively. Among these structures, (Y-2) and (Y-13) are more preferable from the viewpoint of ease of synthesis.

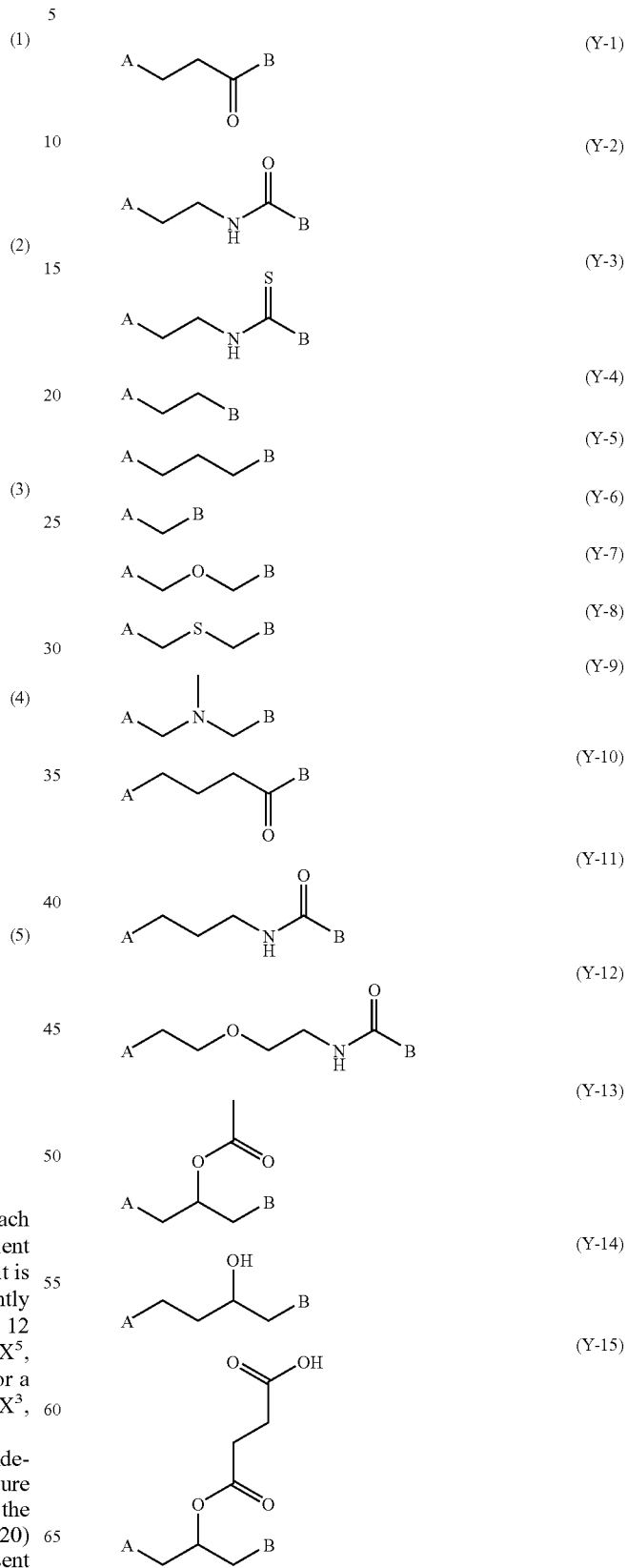

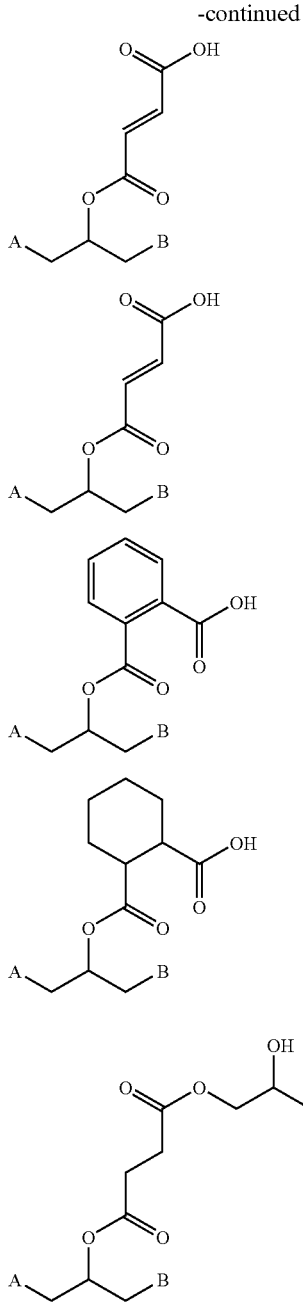

In Formulae (1) to (5), $Z^1$, $Z^2$, $Z^3$, $Z^4$, and $Z^5$ each independently represent a monovalent organic group, and the structure thereof is not particularly limited. Specific examples thereof include a hydroxy group, an alkoxy group, or an aryloxy group, or a heteroaryloxy group, an alkylthio ether group, an arylthioether group, or a hetero arylthioether group, or an amino group. Among these, a monovalent organic group having steric repulsion effects is preferable from the viewpoint of improvement of dispersibility, and an alkyl group having 5 to 24 carbon atoms is preferable. Among these, a branched alkyl group having 5 to 24 carbon atoms or a cyclic alkyl group having 5 to 24 carbon atoms is preferable.

In Formulae (1) to (5), n, m, p, q, and r each independently represent an integer of from 1 to 500.

The total content of the structural units represented by any of Formulae (1) to (5) in the graft copolymer is preferably from 10% by mass to 90% by mass, and more preferably from 30% by mass to 70% by mass, with respect to the total mass of the graft copolymer. When the content is within the above range, sufficient dispersibility of titanium black and sufficient developability when formed into a resist can be obtained. The graft copolymers containing two or more types of graft copolymers having different structures can be used in the invention.

In Formula (5), R represents a monovalent organic group, and the structure thereof is not limited. The monovalent organic group is preferably a hydrogen atom, an alkyl group, an aryl group, or a hetero aryl group, and more preferably a hydrogen atom or an alkyl group. The graft copolymer may contain two or more types of graft moieties in which a substituent represented by R is different in the respective moieties.

In addition to the graft moiety described above, the graft copolymer may have a functional group that can interact with titanium black. Examples thereof include a structural unit having an acidic group, a structural unit having a basic group, a structural unit having a coordination group, and a structural unit having reactivity.

Examples of the acidic group in the structural unit include a carboxylic acid group, a sulfonic acid group, a phosphate group, and a phenolic hydroxyl group. Among these, a carboxylic acid group is preferable since it exhibits favorable adsorbability to titanium black and high dispersibility. These acidic groups can be used singly or in combination of two or more kinds thereof. The introduction of such acidic groups may improve alkaline developability of the graft copolymer.

The content of the structural unit having an acidic group used in the graft copolymer of the invention is preferably from 0.1% by mol to 50% by mol, and more preferably from 1% by mol to 30% by mol in order to prevent damages of image intensity due to the alkaline development.

Examples of the basic group in the structural unit include a primary amino group, a secondary amino group, a tertiary amino group, a heterocyclic group containing N atom, and an amido group. Among these, a tertiary amino group is preferable since it exhibits favorable adsorbability to pigments and high dispersibility. These basic groups can be used singly or in combination of one or more kinds thereof. The content of the structural unit having a basic group used in the graft copolymer of the invention is preferably from 0.01% by mol to 50% by mol, and more preferably from 0.01% by mol to 30% by mol in order to reduce the inhibition of developability.

Examples of the coordination group in the structural unit or the group having reactivity in the structural unit include an acetyl acetoxy group, a trialkoxysilyl group, an isocyanate group, groups derived from an acid anhydride, and groups derived from an acid chloride. Among these, an acetyl acetoxy group is preferable since it exhibits favorable adsorbability to pigments and high dispersibility. These groups can be used singly or in a combination of one or more kinds thereof. The total content of the structural unit having a coordination group and the structural unit having a reactivity used in the graft copolymer of the invention is preferably from 0.5% by mol to 50% by mol, and more preferably from 1% by mol to 30% by mol in order to reduce the inhibition of developability.

The structure of the above-described functional group that can interact with titanium black is not particularly limited as long as it has a functional group that can interact with titanium black on a moiety other than the graft moiety. The structure of the functional group that can interact with titanium black preferably includes at least one repeating unit derived from any one of the monomers represented by the following Formulae (i) to (iii).

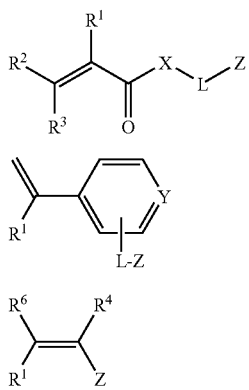

In Formulae (i) to (iii), $R^1$, $R^2$ and $R^3$ each independently represent a hydrogen atom, a halogen atom (for example, a fluorine atom, a chlorine atom, or a bromine atom), or an alkyl group having 1 to 6 carbon atoms (for example, a methyl group, an ethyl group, or a propyl group). It is more preferable that $R^1$, $R^2$ and $R^3$ each independently represent a hydrogen atom or an alkyl group having 1 to 3 carbon atoms; and it is still more preferable that $R^1$, $R^2$ and $R^3$ each independently represent a hydrogen atom or a methyl group. It is still more preferable that $R^2$ and $R^3$ each represent a hydrogen atom.

X represents an oxygen atom (—O—) or an imino group (—NH—), and is preferably an oxygen atom.

L represents a single bond or a divalent linking group. Examples of the divalent linking group include a divalent aliphatic group (for example, an alkylene group, a substituted alkylene group, an alkenylene group, a substituted alkenylene group, an alkynylene group, or a substituted alkynylene group), a divalent aromatic group (for example, an arylene group or a substituted arylene group), and a divalent heterocyclic group, and combinations of these groups and an oxygen atom (—O—), a sulfur atom (—S—), an imino group (—NH—), a substituted imino group (—$NR^{31}$—; in which $R^{31}$ represents an aliphatic group, an aromatic group, or a heterocyclic group) or a carbonyl group (—CO—).

The divalent aliphatic group may have a cyclic structure or a branched structure. The number of carbon atoms of the aliphatic group is preferably from 1 to 20, more preferably from 1 to 15, and still more preferably from 1 to 10. The aliphatic group is preferably a saturated aliphatic group rather than an unsaturated aliphatic group. The aliphatic group may have a substituent. Examples of the substituent include a halogen atom, a hydroxyl group, an aromatic group, and a heterocyclic group.

In the divalent aromatic group, the number of carbon atoms is preferably from 6 to 20, more preferably from 6 to 15, and still more preferably from 6 to 10. The aromatic group may have a substituent. Examples of the substituent include a halogen atom, a hydroxyl group, an aliphatic group, an aromatic group, and a heterocyclic group.

The heterocyclic ring of the divalent heterocyclic group is preferably 5- or 6-membered ring. Other heterocyclic ring, aliphatic ring, or aromatic ring may be condensed with the heterocyclic ring. The heterocyclic group may have a substituent. Examples of the substituent include a halogen atom, a hydroxy group, an oxo group (=O), a thioxo group (=S), an imino group (=NH), a substituted imino group (=N—$R^{32}$; in which $R^{32}$ represents an aliphatic group, an aromatic group, or a heterocyclic group), an aliphatic group, an aromatic group, and a heterocyclic group.

L preferably represents a divalent linking group including a single bond, an alkylene group, or an oxyalkylene structure. The oxyalkylene structure is more preferably an oxyethylene structure or an oxypropylene structure. L may be a polyoxyalkylene structure containing two or more repeats of oxyalkylene structures. The polyoxyalkylene structure is preferably a polyoxyethylene structure or a polyoxypropylene structure. The polyoxyethylene structure is represented by —$(OCH_2CH_2)_n$—, in which n is preferably an integer of 2 or more, and more preferably an integer of from 2 to 10.

In Formulae (i) to (iii), Z represents a functional group that can interact with titanium black on a moiety other than the graft moiety. Z preferably represents carboxylic acid group or a tertiary amino group, and more preferably a carboxylic acid group. Y represents a methine group or a nitrogen atom.

In Formula (iii), $R^4$, $R^5$, and $R^6$ each independently represent a hydrogen atom, a halogen atom (for example, a fluorine atom, a chlorine atom, or a bromine atom), an alkyl group having 1 to 6 carbon atoms (for example, a methyl group, an ethyl group, and a propyl group), Z, or -L-Z. Here, L and Z have the same definitions as L and Z in Formulae (i) to (iii), respectively. It is preferable that $R^4$, $R^5$, and $R^6$ each independently represent a hydrogen atom or an alkyl group having 1 to 3 carbon atoms; and it is more preferable that $R^4$, $R^5$, and $R^6$ each represent a hydrogen atom.

In the invention, in the monomer represented by Formula (1), it is preferable that R', and $R^2$ and $R^3$ each independently represent a hydrogen atom or a methyl group, L represents an alkylene group a or divalent linking group having an oxyalkylene structure, X represents an oxygen atom or an imino group, and Z represents a carboxylic acid group.

In the monomer represented by Formula (II), it is preferable that $R^1$ represents a hydrogen atom or a methyl group, L represents an alkylene group, Z represents a carboxylic acid group, and Y represents a methine group.

In the monomer represented by Formula (iii), it is preferable that $R^4$, $R^5$, and $R^6$ each independently represent a hydrogen atom or a methyl group, and Z represents a carboxylic acid group.

Examples of typical compounds represented by Formulae (i) to (iii) include:

methacrylic acid, crotonic acid and isocrotonic acid;

a reaction product of a compound having an addition-polymerizable double bond and a hydroxy group (for example, 2-hydroxyethyl methacrylate) and a succinic anhydride;

a reaction product of a compound having an addition-polymerizable double bond and a hydroxy group and a phthalic anhydride;

a reaction product of a compound having an addition-polymerizable double bond and a hydroxy group and a tetrahydroxyphthalic anhydride;

a reaction product of a compound having an addition-polymerizable double bond and a hydroxy group and a trimellitic anhydride;

a reaction product of a compound having an addition polymerizable double bond and a hydroxy group and a pyromellitic anhydride; and acrylic acid, an acrylic acid dimer, an acrylic acid oligomer, maleic acid, itaconic acid, fumaric acid, 4-vinylbenzoic acid, vinyl phenol, and 4-hydroxyphenyl methacrylamide.

In view of the interaction with titanium black, dispersion stability, and permeability in a developer, the content, in the graft copolymer, of the functional group, such as the monomer having an acidic group, that can interact with titanium black is preferably from 0.05% by mass to 90% by mass, more preferably from 1.0% by mass to 80% by mass, and still more preferably from 10% by mass to 70% by mass, with respect to the total mass of the graft copolymer.

For the purpose of improving properties such as image intensity, in addition to the structural unit having the graft moiety and the functional group that can interact with titanium black, the graft copolymer in the dispersion composition for titanium black according to the invention may further include an additional structural unit having various functions (for example, a structural unit that has a functional group having compatibility with a dispersion medium used in a dispersion) as a copolymerization component, as long as the effects of the invention are not adversely affected.

Examples of the copolymerization component in the graft copolymer according to the invention include radical polymerizable compounds selected from acrylates, methacrylates, styrenes, acrylonitriles or methacrylonitriles. These copolymerization components can be used singly or in combination of two or more kinds thereof. The content of the copolymerization component in the graft copolymer is preferably from 0% by mol to 90% by mol, and more preferably from 0% by mol to 60% by mol. When the content is within the above range, sufficient pattern formation properties can be obtained.

Examples of solvents used in synthesizing the graft copolymer include ethylene dichloride, cyclohexanone, methyl ethyl ketone, acetone, methanol, ethanol, propanol, butanol, ethylene glycol monomethyl ether, ethylene glycol monoethyl ether, 2-methoxy ethyl acetate, 1-methoxy-2-propanol, 1-methoxy-2-propyl acetate, N,N-dimethylformamide, N,N-dimethylacetamide, dimethyl sulfoxide, toluene, ethyl acetate, methyl lactate, and ethyl lactate. These solvents may be used singly or as a mixture of two or more kinds thereof.

Specific examples of such the copolymers include the following exemplified compounds I to 54. The numeric value of each constituent unit (main chain portion) represents a percentage by mass.

Exemplified Compound 1

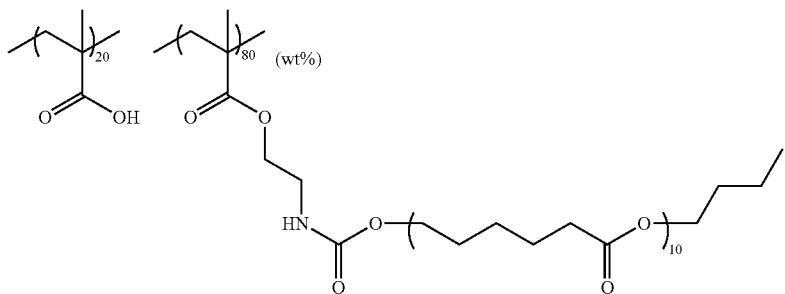

Exemplified Compound 2

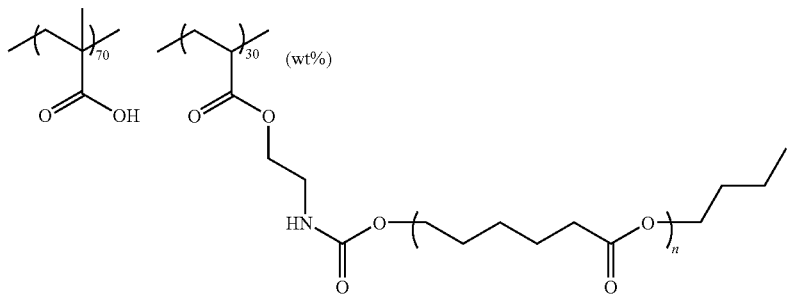

Exemplified Compound 3

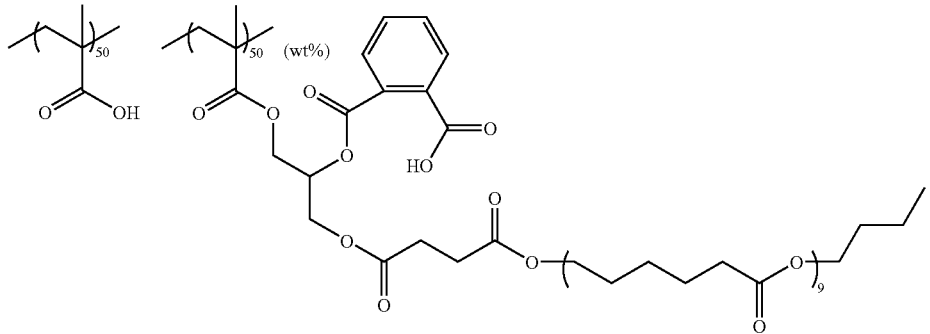

Exemplified Compound 4

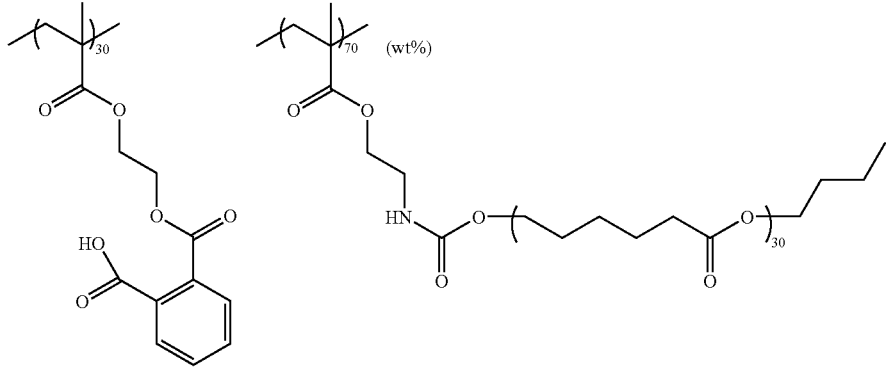

-continued
Exemplified Compound 5
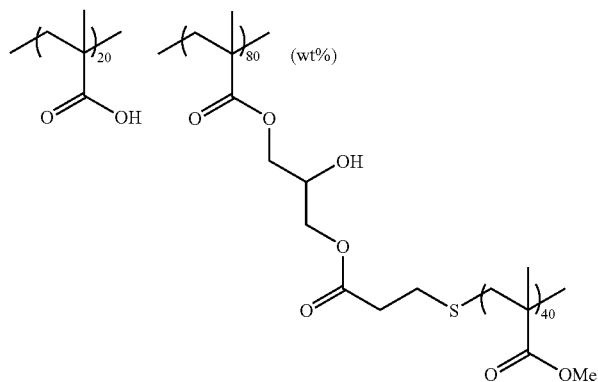
Exemplified Compound 6
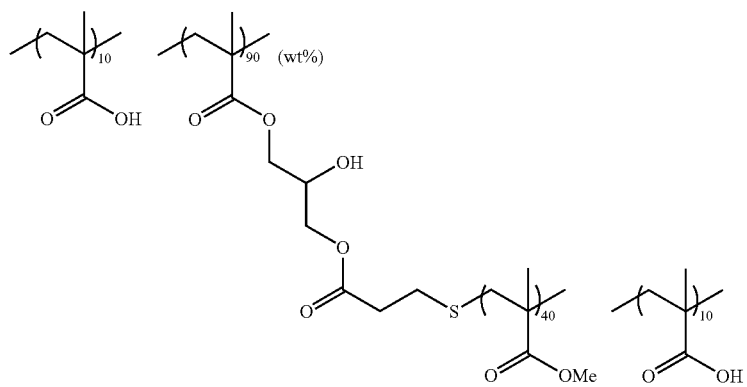
Exemplified Compound 7
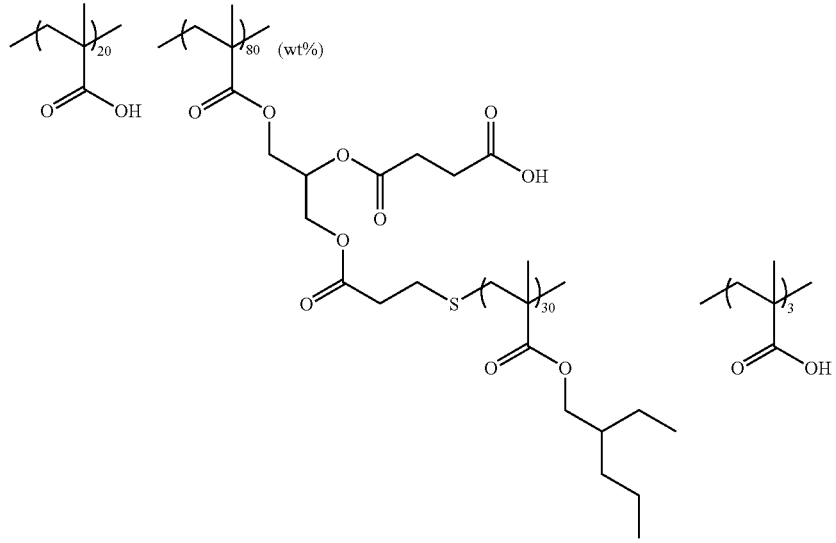
Exemplified Compound 8
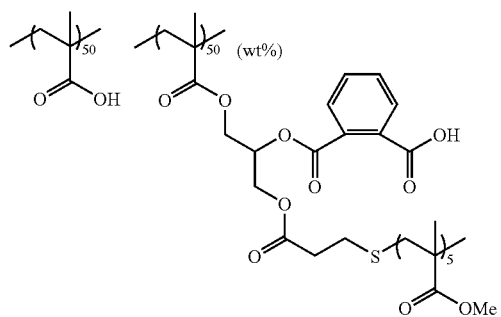
Exemplified Compound 9
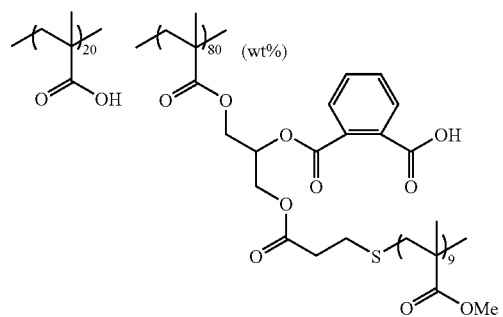

Exemplified Compound 10
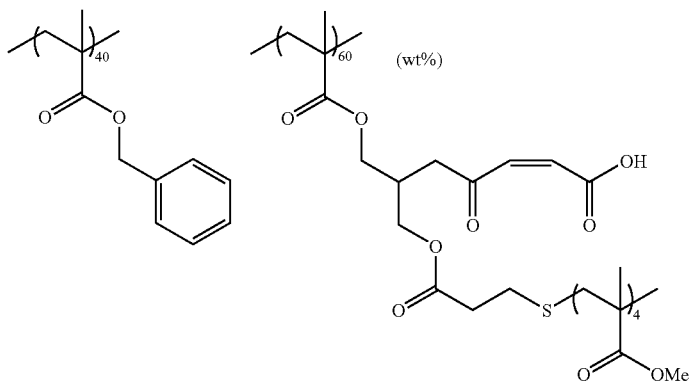
Exemplified Compound 11
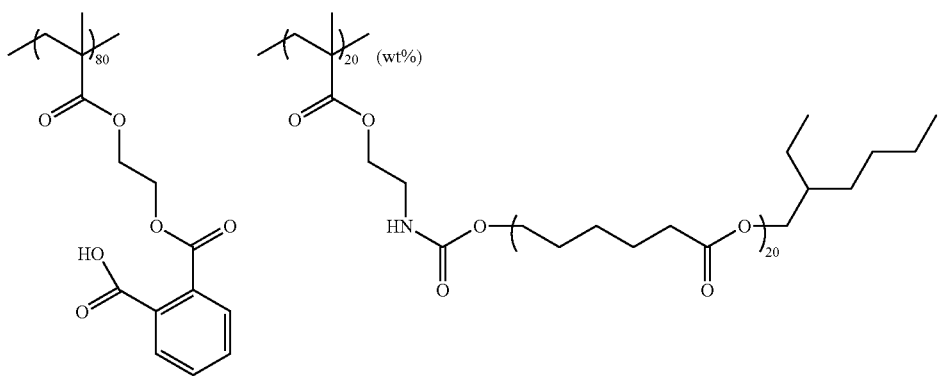
Exemplified Compound 12
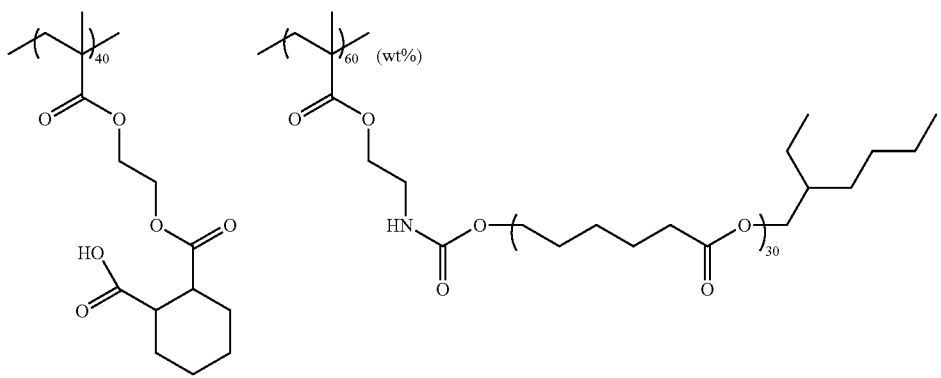
Exemplified Compound 13
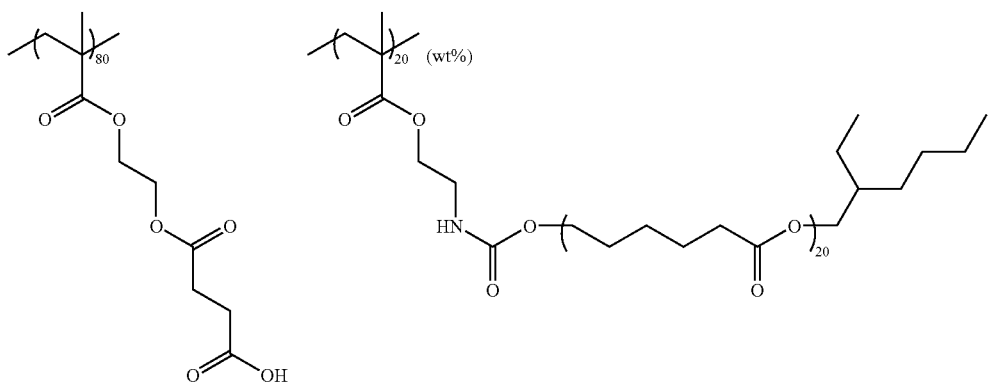

Exemplified Compound 14
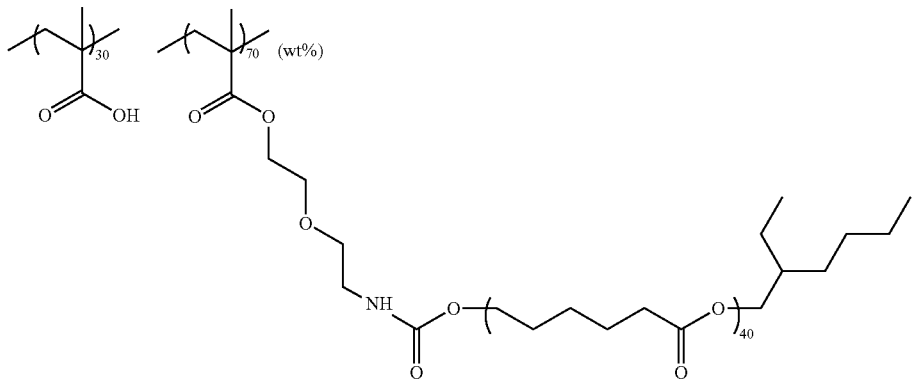
Exemplified Compound 15
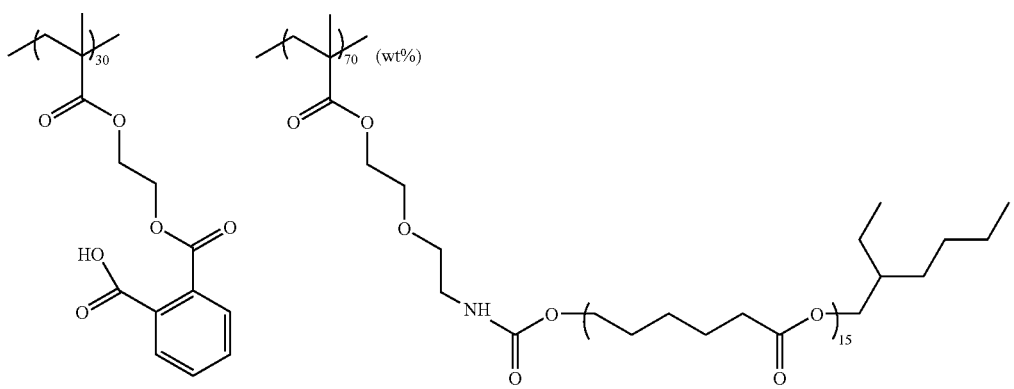
Exemplified Compound 16
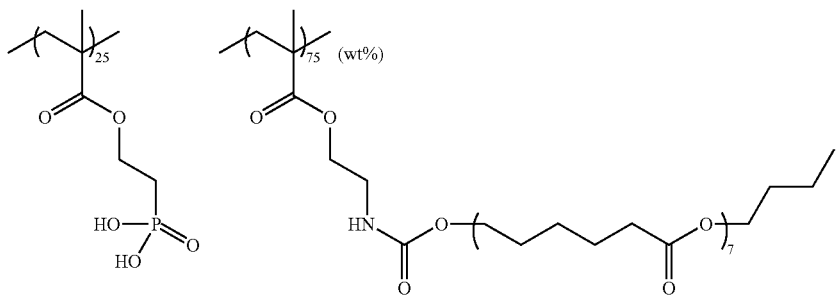
Exemplified Compound 17
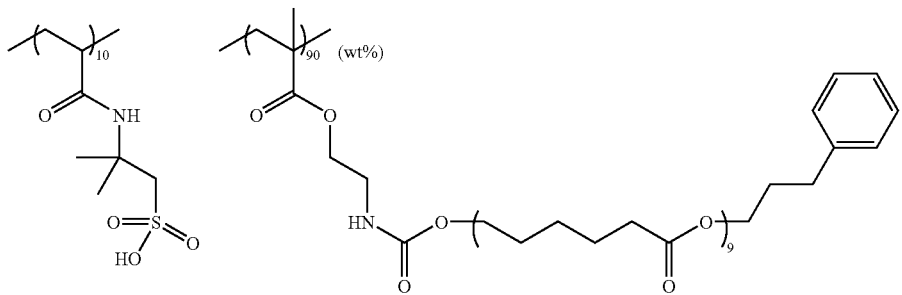

Exemplified Compound 18
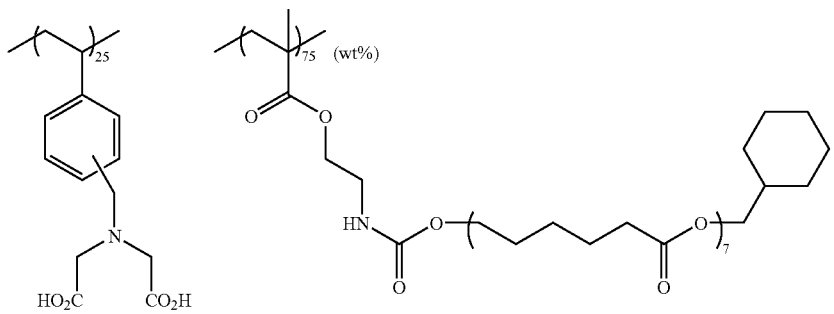
Exemplified Compound 19
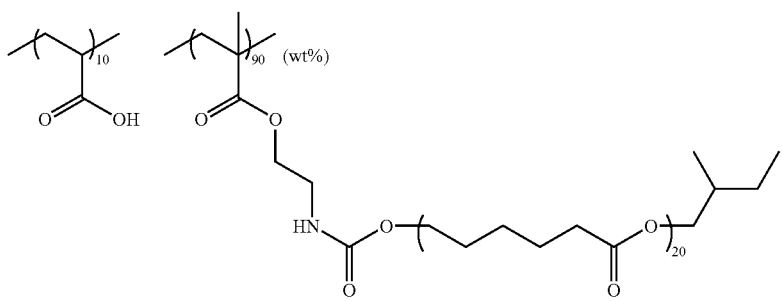
Exemplified Compound 20
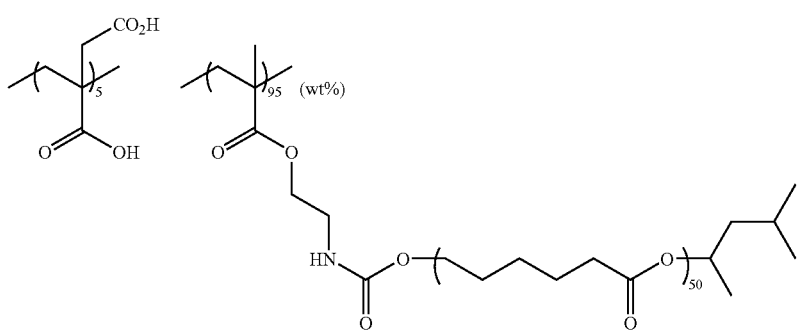
Exemplified Compound 21
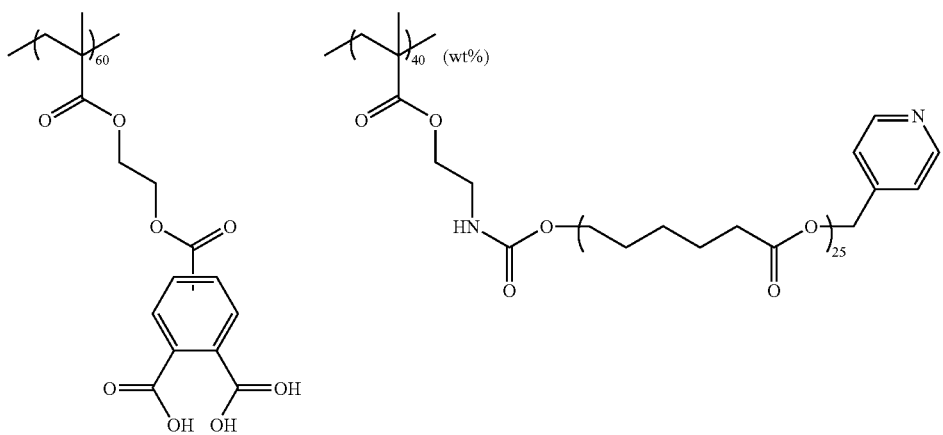

-continued
Exemplified Compound 22
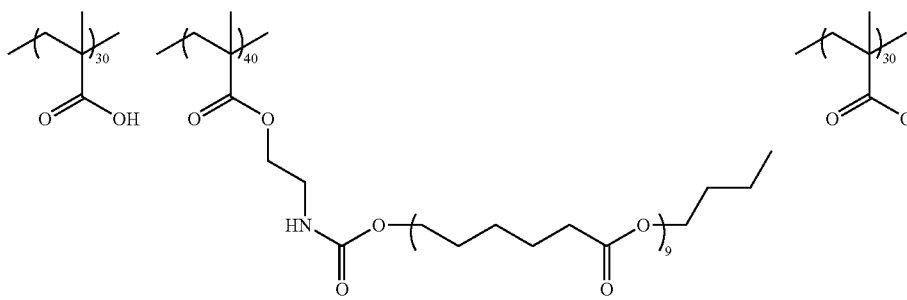
Exemplified Compound 23
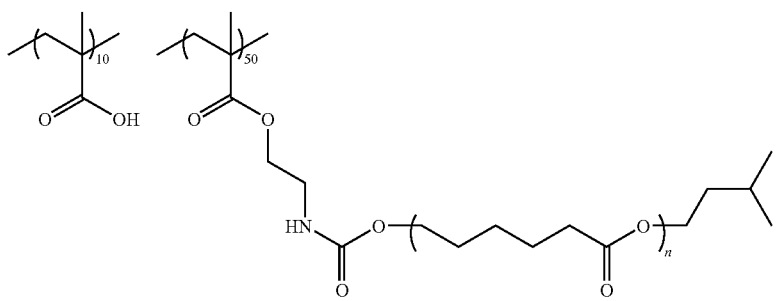
Exemplified Compound 24
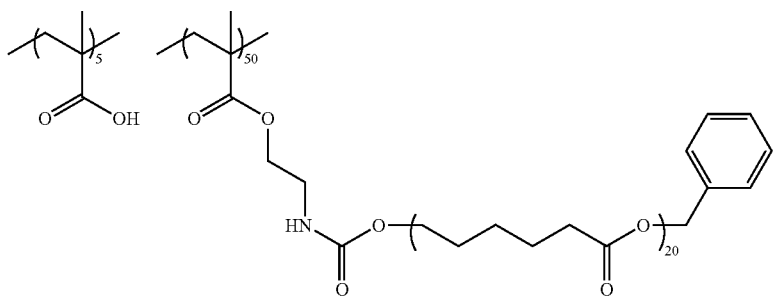
Exemplified Compound 25
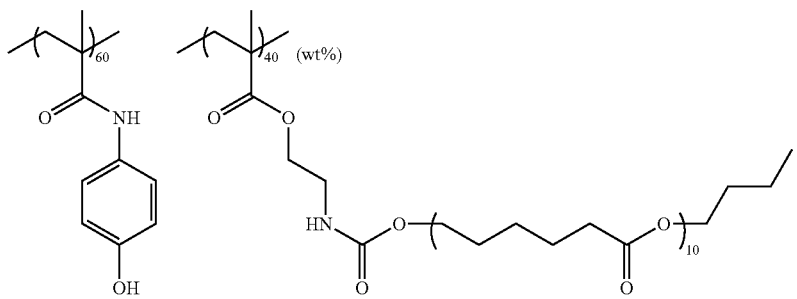
Exemplified Compound 26
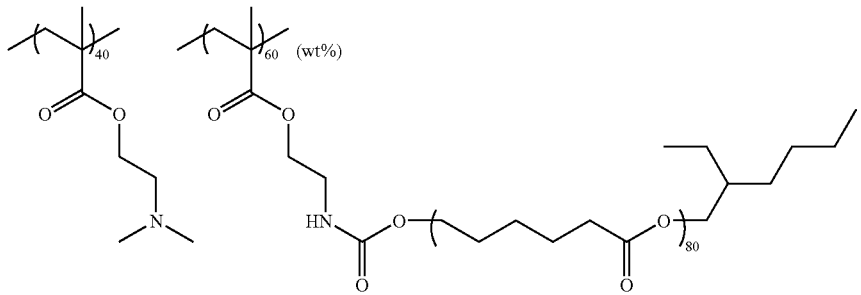

-continued
Exemplified Compound 27
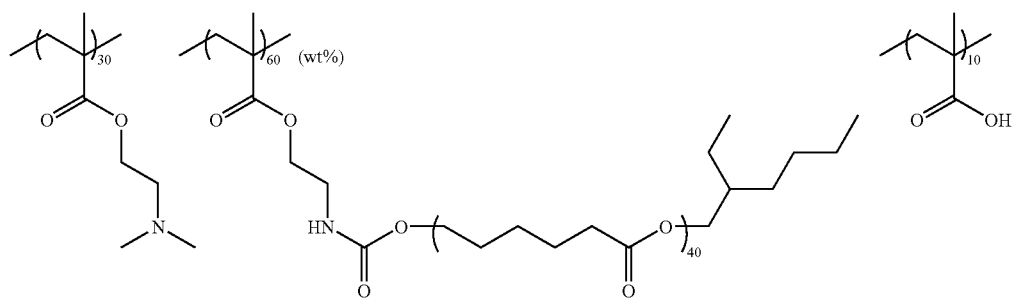
Exemplified Compound 28
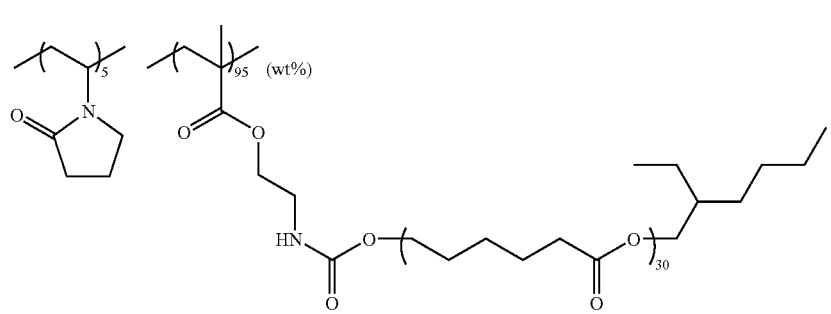
Exemplified Compound 29
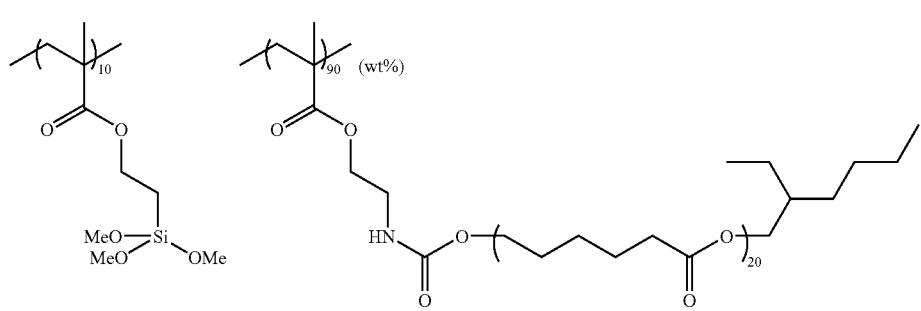
Exemplified Compound 30
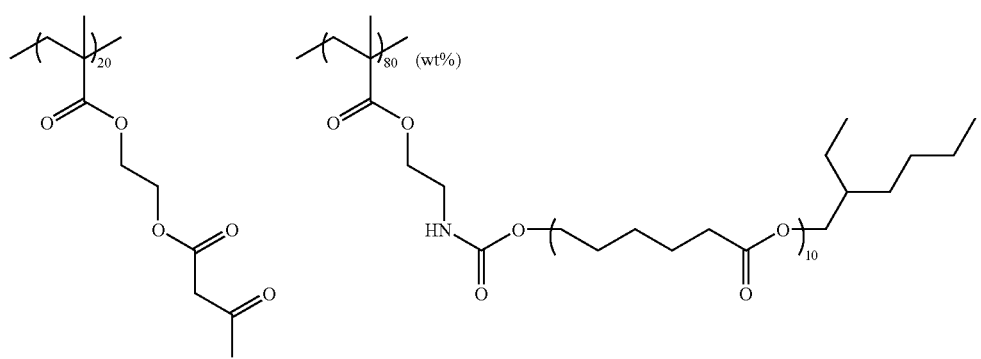
Exemplified Compound 31
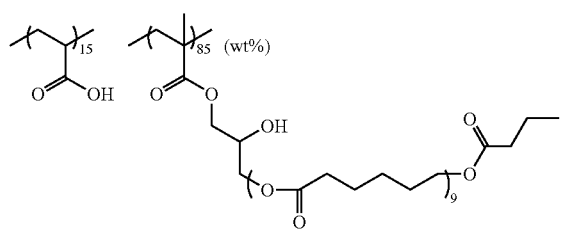
Exemplified Compound 32
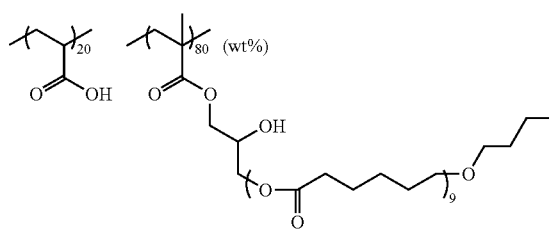

-continued
Exemplified Compound 33
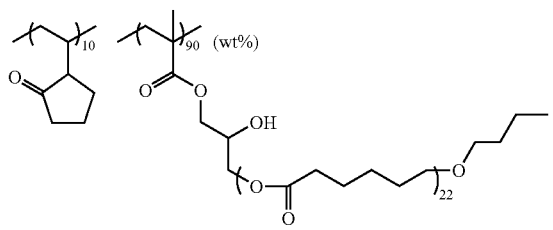
Exemplified Compound 34
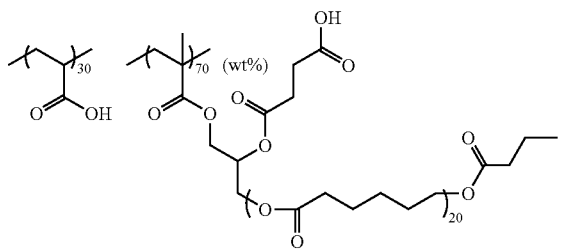
Exemplified Compound 35
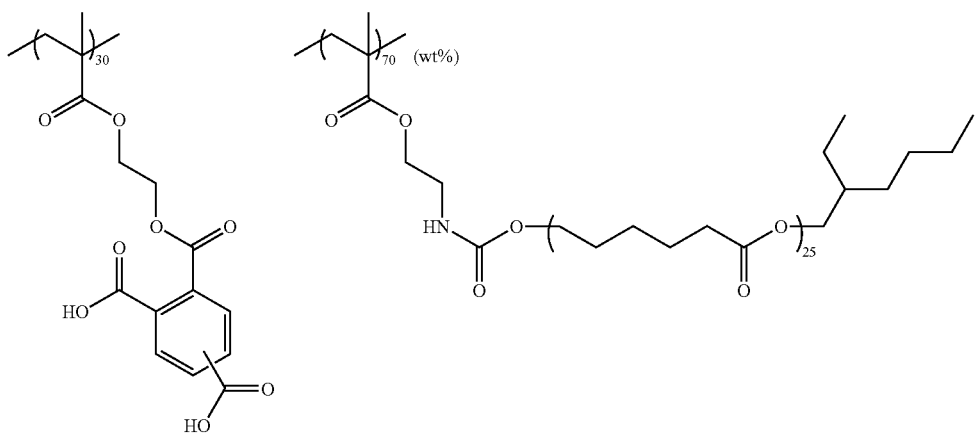
Exemplified Compound 36
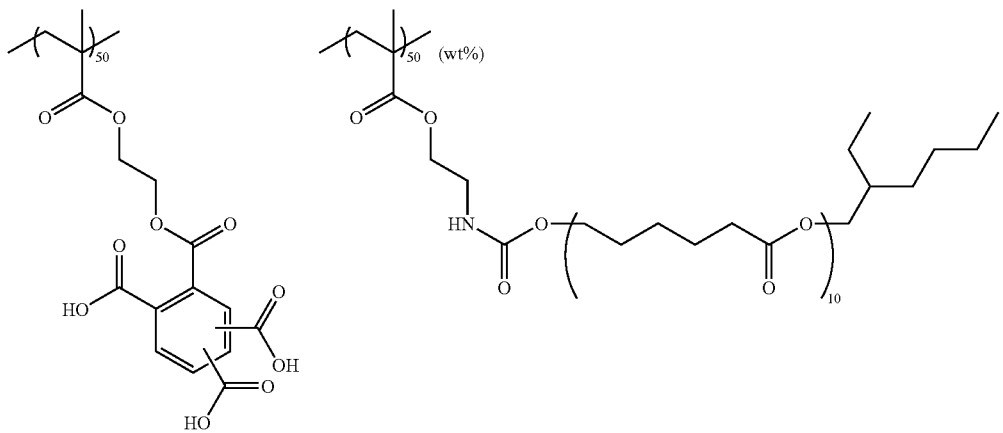
Exemplified Compound 37
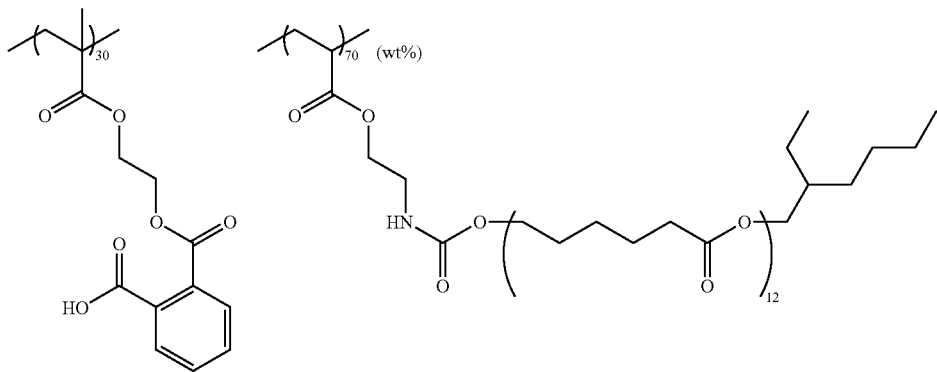

Exemplified Compound 38
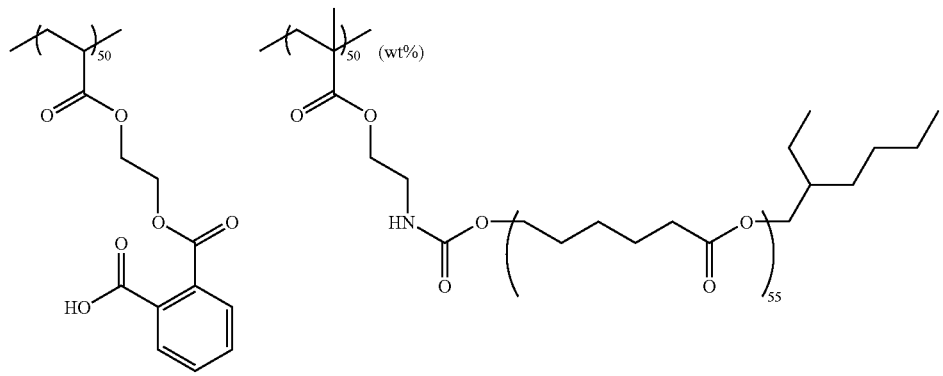
Exemplified Compound 39
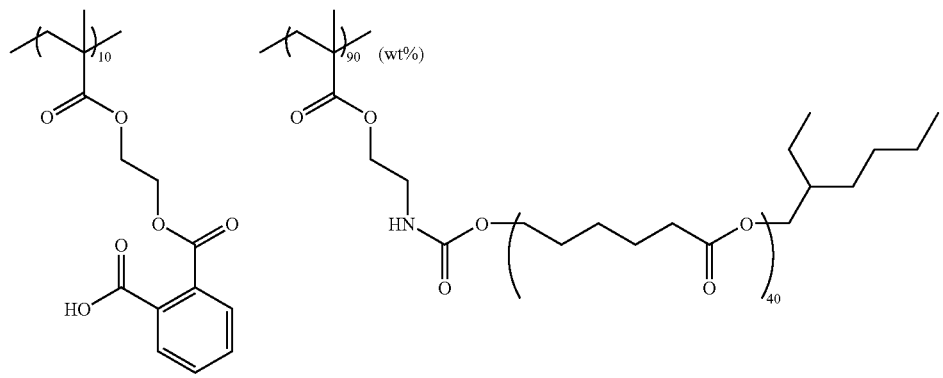
Exemplified Compound 40
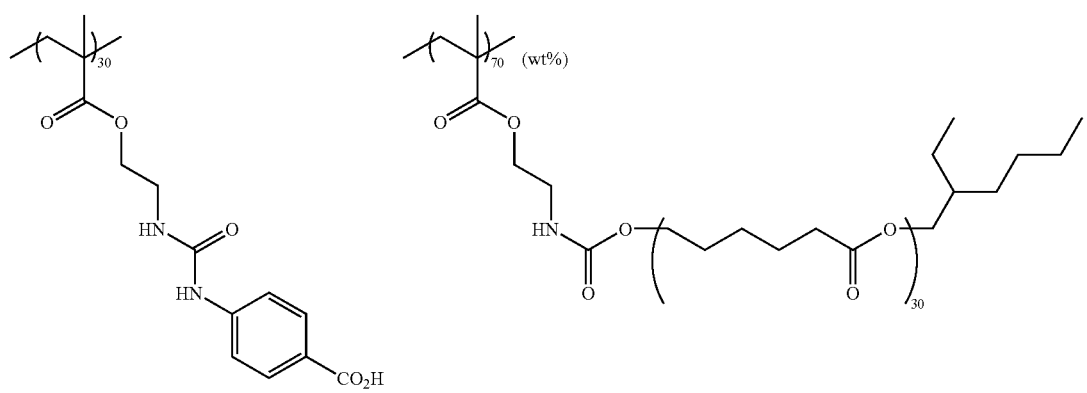
Exemplified Compound 41
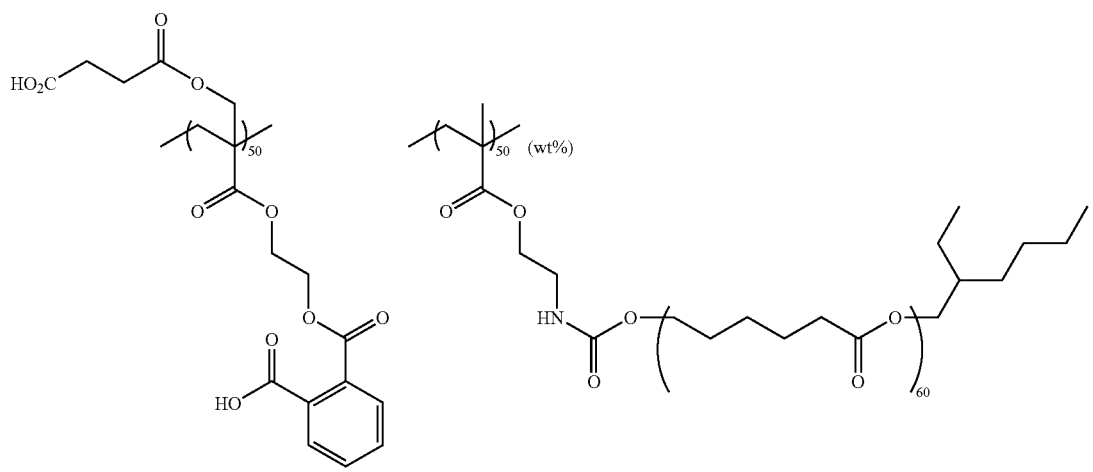

-continued
Exemplified Compound 42
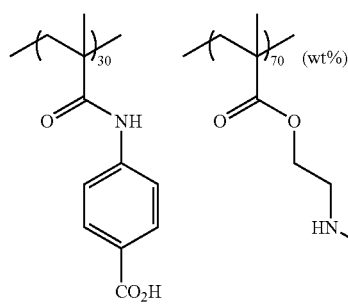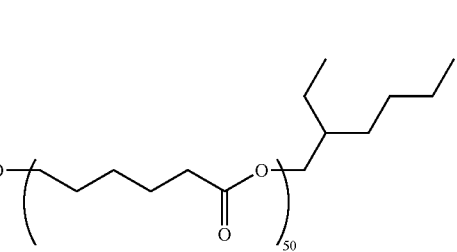
Exemplified Compound 43
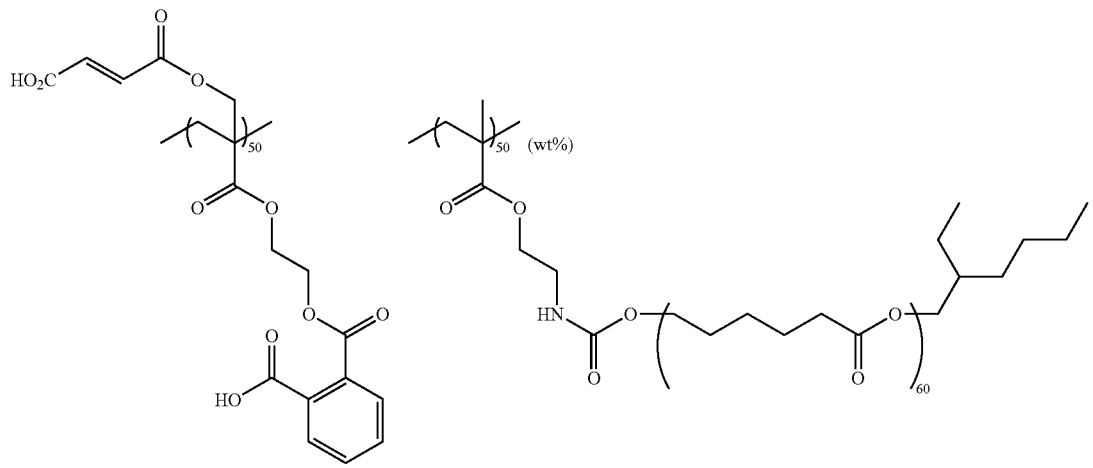
Exemplified Compound 44
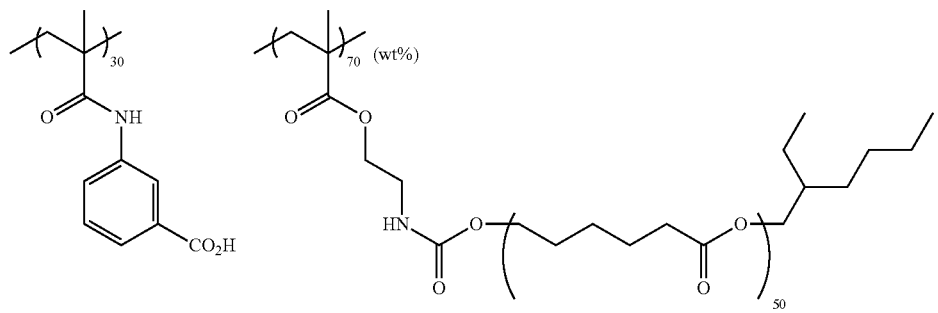
Exemplified Compound 45
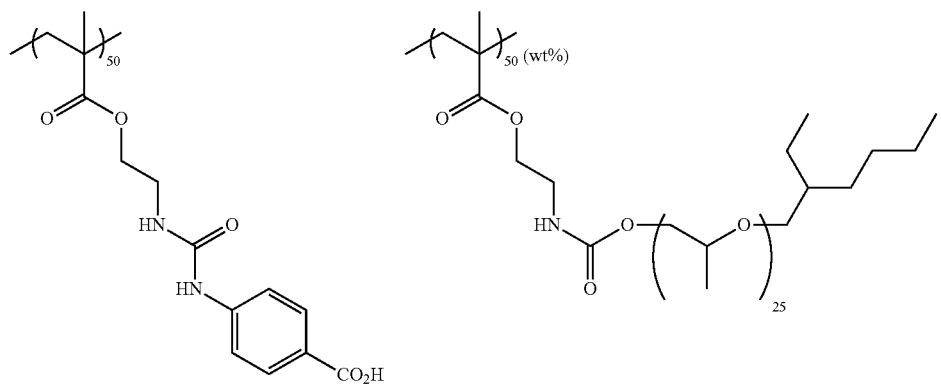

Exemplified Compound 46
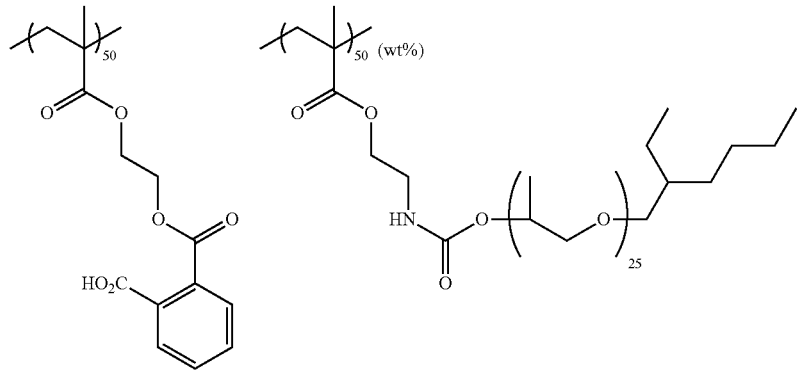
Exemplified Compound 47
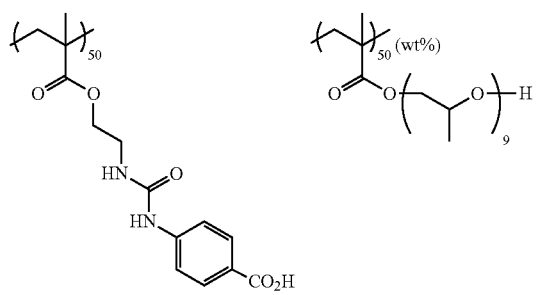
Exemplified Compound 48
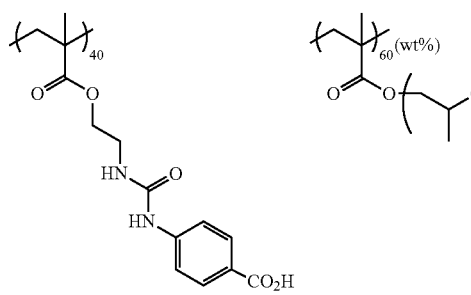
Exemplified Compound 49
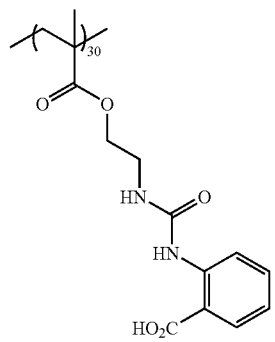
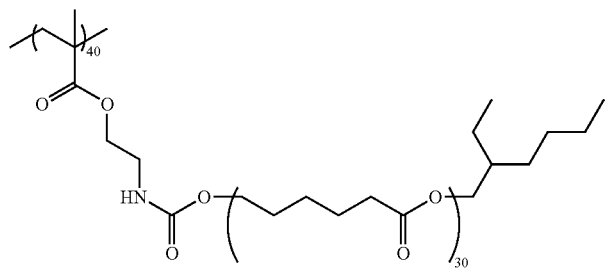
Exemplified Compound 50
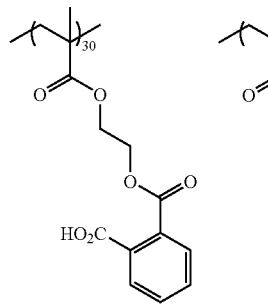
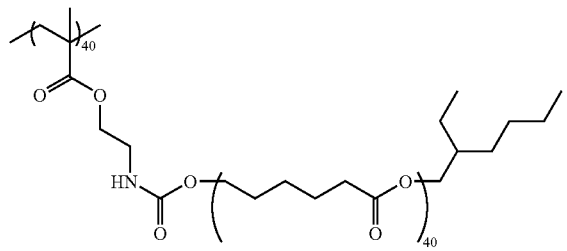
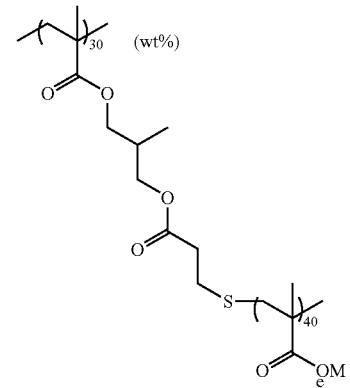

Exemplified Compound 51
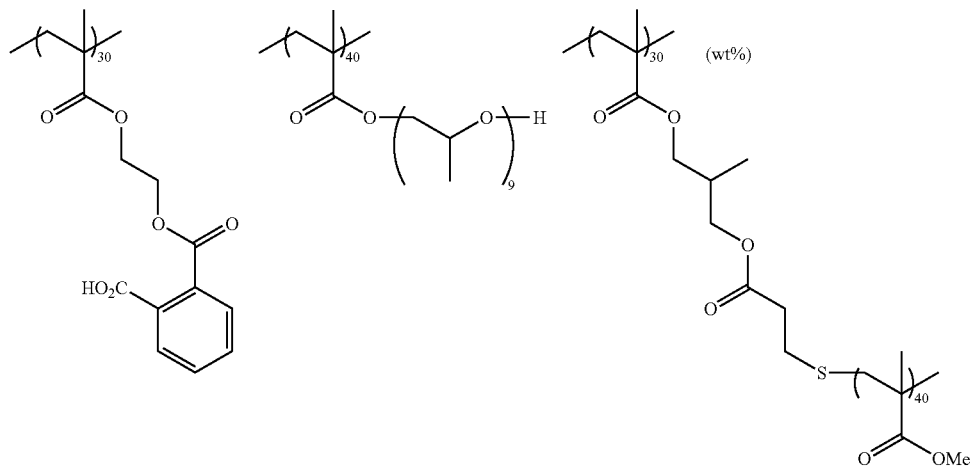
Exemplified Compound 52
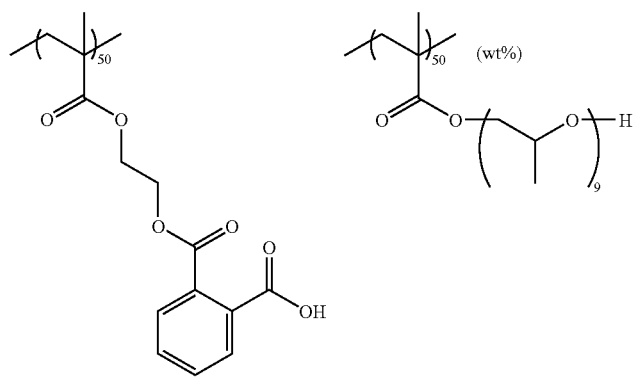
Exemplified Compound 53
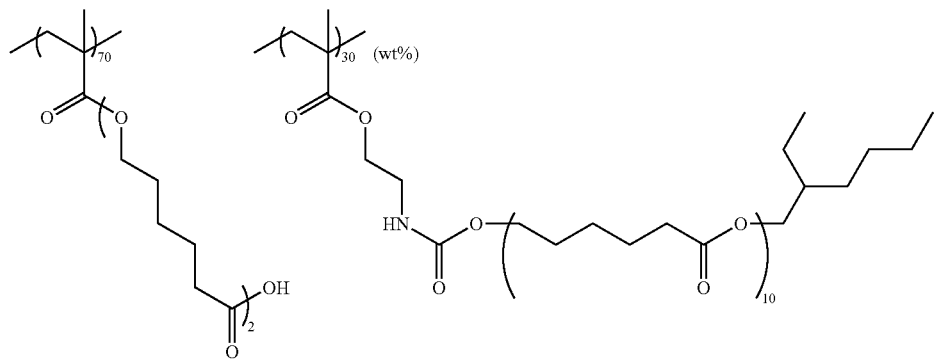
Exemplified Compound 54
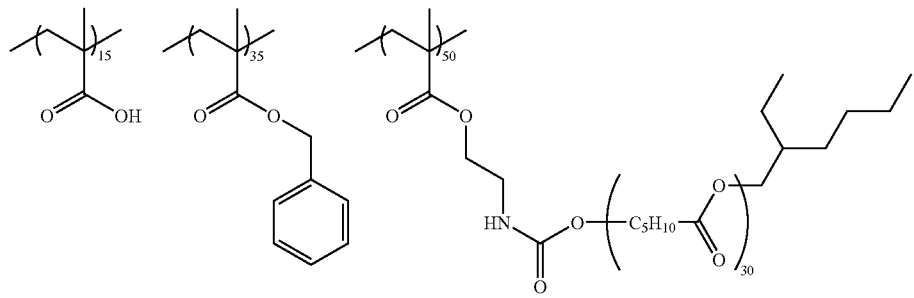

The dispersant in the invention can modify the surface of a pigment and can promote the adsorption of a dispersion resin onto the pigment.

In the invention, as long as at least a part of the dispersant used in the invention has an acid value of 50 mgKOH/g or more, an additional dispersant may also be used. As the additional dispersant, a dispersant other than the above-described graft copolymers may be used. The additional dispersant classified into a straight chain polymer, a terminal modified polymer, a graft polymer or a block polymer according to its structure. A high molecular weight dispersant other than the graft polymers can also be used as the additional dispersant. The additional dispersant is preferably a terminal modified polymer or a block polymer in terms of having a moiety for anchoring the surface of titanium black (and another pigment depending on cases).

Examples of additional the dispersant other than the graft copolymer include high-molecular-weight dispersants, such as a polyamidoamine and salts thereof, a polycarboxylic acid and salts thereof, a high-molecular-weight unsaturated acid ester, a modified polyurethane, a modified polyester, a modified poly(meth)acrylate, a (meth)acrylic copolymer, or a naphthalene sulfonic acid-formaldehyde condensate; a polyoxyethylene alkyl phosphate, a polyoxyethylene alkylamine, an alkanolamine, and pigment derivatives. Specific examples of the additional dispersant that can be used in the invention include: DISPERBYK-101 (polyamidoamine phosphate), DISPERBYK-107 (carboxylate), DISPERBYK-110 (copolymer containing an acidic group), DISPERBYK-130 (polyamide), DISPERBYK-161, -162, -163, -164, -165, -166 and -170 (high-molecular-weight copolymer) and BYK-P104, P105 (high-molecular-weight unsaturated polycarboxylic acid) (all trade names, manufactured by BYK-Chemie); EFKA4047, 4050, 4010 and 4165 (polyurethane base dispersant), EFKA4330 and 4340 (block copolymer) and EFKA 4400 and 4402 (modified polyacrylate), EFKA 5010 (polyester amide), EFKA 5765 (high molecular weight polycarboxylic acid salt), EFKA 6220 (fatty acid polyester), EFKA 6745 (phthalocyanine derivative), and EFKA 6750 (azo pigment derivative) (all trade names, manufactured by EFKA); AJISPER PB821 and PB822 (all trade names, manufactured by Ajinomoto fine techno Co., Inc.); FLOWLEN TG-710 (urethane oligomer) and POLYFLOW No. 50E and No. 300 (acrylic copolymer) (all trade names, manufactured by KYOEISHA CHEMICAL Co., Ltd.); DISPARLON KS-860, 873SN, 874, and #2150 (aliphatic polycarboxylic acid), DISPARLON #7004 (polyether ester), DISPARLON DA-703-50, DA-705, and DA-725 (all trade names, manufactured by KUSUMOTO CHEMICALS, Ltd.), DEMOL RN and N (naphthalenesulfonic acid formalin polycondensate), DEMOL MS, C, and SN-B (aromatic sulfonic acid-formaldehyde polycondensate), HOMOGENOL L-18 (high-molecular-weight polycarboxylic acid), EMULGEN 920, 930, 935 and 985 (polyoxyethylene nonylphenyl ether), ACETAMIN 86 (stearylamine acetate) (all trade names, manufactured by Kao Corp.); SOLSPERSE 5000 (phthalocyanine derivative), SOLSPERSE 22000 (azo pigment derivative), SOLSPERSE 13240 (polyesteramine), SOLSPERSE 3000, 17000 and 27000 (polymer having a function portion at the terminal), SOLSPERSE 24000, 28000, 32000, and 38500 (graft polymer) (all trade names, available from Lubrizol Corporation); and NIKKOL T106 (polyoxyethylene sorbitan monooleate) and NIKKOL MYS-IEX (polyoxyethylene monostearate) (all trade names, manufactured by Nikko Chemical Co., Ltd.).

These dispersants may be used singly or in combination of two or more kinds thereof.

The weight average molecular weight of the dispersant of the invention is preferably from 10,000 to 300,000, more preferably from 15,000 to 200,000, even more preferably from 20,000 to 100,000, and still more preferably from 25,000 to 50,000, in terms of developability and suppressing the separation of a pattern during development. The weight average molecular weight can be measured, for example, by a GPC method.

In view of dispersibility and dispersion stability, the total content of the dispersant in the dispersion composition of the invention is preferably from 0.1% by mass to 50% by mass, more preferably from 5% by mass to 40% by mass, and still more preferably from 10% by mass to 30% by mass, with respect to the total solid content of the dispersion composition.

Solvent

The dispersion composition of the invention may include various organic solvents as a solvent.

Examples of the solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, ethyl acetate, butyl acetate, methyl lactate, and ethyl lactate.

These solvents may be used singly or as a mixture. The concentration of the solid content in the solvent is preferably from 2% by mass to 60% by mass.

In addition to the above-described components, the dispersion composition of the invention may contain, components for a photosensitive resin composition described below (for example, a resin, a photopolymerization initiator or a polymerizable compound). More specifically, a photosensitive resin composition may be prepared by a process of producing a dispersion composition.

Photosensitive Resin Composition for Light-Shielding Color Filter and Production Method Thereof In the present invention, a method of producing a photosensitive resin composition for a light-shielding color filter containing titanium black, the resin, the polymerizable compound, the photopolymerization initiator, the solvent and the dispersant including at least the first dispersant and the second dispersant (hereinafter sometimes simply referred to as a "photosensitive resin composition") includes dispersing a mixed liquid containing the titanium black, the first dispersant and the solvent, and adding the second dispersant to the dispersed mixed liquid and dispersing the same, in which at least a part of the dispersant has an acid value of 50 mgKOH/g or more.

The photosensitive resin composition for a light-shielding color filter of the invention is produced by the above-described method of producing a photosensitive resin composition for a light-shielding color filter.

According to the photosensitive resin composition of the invention and the production method thereof, the aggregation of titanium black can be prevented and the dispersion stability can be remarkably improved. Therefore, when a light-shielding color filter is produced on a substrate having a further structure provided thereon by using the photosensitive resin composition of the invention, the separation of the light-shielding color filter can be suppressed.

The timing of adding each component in the method of producing a photosensitive resin composition of the invention is not particularly limited, as long as the first stage of dispersion treatment and the second stage of dispersion treatment are conducted during a process of preparing the photosensitive resin composition of the invention containing the titanium black, the dispersant, the resin (a resin other than the dispersant), the polymerizable compound, the photopolymerization initiator and the solvent. For example, the photosensitive resin composition of the invention can be produced by preparing a dispersion composition according to the above-described method of producing the dispersion composition of the invention, and subsequently adding each component of the resin, the polymerizable compound, and the photopolymerization initiator (and, if necessary, the solvent) to the produced dispersion composition. In the method of producing a dispersion composition of the invention, at least one of the resin, the polymerizable compound or the photopolymerization initiator may be added to dispersion composition in advance, and then the remaining components of the photosensitive resin composition may be added to the obtained dispersion composition.

In the method of producing a dispersion composition of the invention, all amount of the resin, the polymerizable compound and the photopolymerization initiator may be added to the dispersion composition, thereby producing a photosensitive resin composition as a dispersion composition.

Among the components of the photosensitive resin composition of the invention, the definitions of the titanium black, the dispersant and the solvent are the same as those described in detail in "Dispersion composition and producing method thereof" above. The preferable definitions thereof are also the same as those described in detail in "Dispersion composition and producing method thereof" above. Hereinafter, the components of the photosensitive resin composition of the invention that includes the resin, the polymerizable compound, the photopolymerization initiator and other components are described in detail.

Resin

The photosensitive resin composition of the invention contains a resin (a resin other than the above-described dispersant).

The resin is preferably a linear organic polymer. As the linear organic polymer, known linear organic polymers can be appropriately used. It is preferable to use a linear organic polymer that is soluble or swellable in water or weak alkaline water, in order to use for water development or weak alkali water development.

In addition to the intended use as a film formation material, the linear organic polymer can be selected according to the intended use as a developing material for water, weak alkaline water or organic solvent developing. For example, water development can be achieved when a water soluble organic polymer is used.

Examples of the linear organic polymer include a radical polymer having a carboxylic acid group at a side chain thereof (for example, described in JP-A No. 59-44615, JP-B Nos. 54-34327, 58-12577, and 54-25957, and JP-A Nos. 54-92723, 59-53836, and 59-71048) such as a resin obtained by homopolymerization or copolymerization of a monomer having a carboxyl group; a resin obtained by homopolymerization or copolymerization of a monomer having an acid anhydride and by hydrolyzing, half-esterifing, or half-amidizing an acid anhydride unit; and an epoxy acrylate obtained by modifying an epoxy resin with unsaturated monocarboxylic acid and acid anhydride. Examples of the monomer having a carboxyl group include acrylic acid, methacrylic acid, itaconic acid, crotonic acid, maleic acid, fumaric acid, and 4-carboxyl styrene. Examples of the monomer having acid anhydride include maleic anhydride. Examples of the linear organic polymer further include an acid cellulose derivative having a carboxylic acid group at aside chain thereof. Examples of the linear organic polymer also include a linear organic polymer obtained by addition polymerization of a cyclic anhydride with a hydroxyl group containing polymer.

Among these linear organic polymers, the linear organic polymer that is soluble or swellable in weak alkaline water is sometimes referred to as an "alkali soluble resin".

Among these resins, a (meth)acrylic resin having a carboxyl group and an allyl group and/or a vinyl ester group at a side chain thereof; an alkali soluble resin having a double bond at a side chain thereof (for example, described in JP-A Nos. 2000-187322 and 2002-62698); and an alkali soluble resin having an amido group at a side chain thereof (for example, described in JP-A No. 2001-242612) are preferable in that the balance between film strength, sensitivity and developability is excellent. Furthermore, a urethane binder polymer containing an acidic group (for example, described in JP-B Nos. 7-12004, 7-120041, 7-120042, and 8-12424 and JP-A Nos. 63-287944, 63-287947, 1-271741, and 10-116232); and a urethane binder polymer having an acidic group and a double bond at a side chain thereof (for example, described in JP-A No. 2002-107918) have excellent strength and thus are preferable in terms of print durability and low exposure suitability. In addition, an acetal-modified polyvinyl alcohol binder polymer having an acidic group (for example, described in European Patent Nos. 993966 and 1204000, and JP-A No. 2001-318463) is preferable in that the balance between film strength and developability is excellent. Furthermore, polyvinyl pyrrolidone and polyethylene oxide are preferable as the water soluble linear organic polymer. In order to increase the strength of a cured film, alcohol soluble nylon and a polyether of 2,2-bis-(4-hydroxyphenyl)-propane and epichlorohydrine are also preferable.

Among these resins, a resin having a polymerizable group is preferable. The polymerizable group is preferably a double bond, and more preferably an acryloyl group or a methacryloyl group. The resin may be any of a random polymer, a block polymer, and a graft polymer.

The weight average molecular weight of the resin is preferably 5,000 or more and more preferably from 10,000 to 300,000. The number average molecular weight of the resin is preferably 1,000 or more and more preferably from 2,000 to 250,000. The polydispersion degree (weight average molecular weight/number average molecular weight) is preferably 1 or more and more preferably from 1.1 to 10.

The resin may be used singly or in combination of two or more kinds thereof.

In order to obtain the effects of the invention more efficiently, the content (the total content, when two or more kinds of resins are used) of the resin in the photosensitive resin composition is not particularly limited, and is preferably from 5% by mass to 50% by mass, more preferably from 10% by mass to 40% by mass, and still more preferably from 10% by mass to 35% by mass, with respect to the total solid content of the photosensitive resin composition.

Polymerizable Compound

The photosensitive resin composition of the invention contains at least one polymerizable compound.

Examples of the polymerizable compound include an addition polymerizable compound having at least one ethylenically unsaturated double bond. Specifically, the polymerizable compound is selected from compounds having at least one terminal ethylenically unsaturated bond and preferably from compounds having two or more terminal ethylenically unsaturated bonds. These compounds are known in the art, and can be used without particular limitation in the present invention. These compounds may be in any form of a monomer, a prepolymer such as a dimer, a trimer or an oligomer, or may be a mixture or a (co)polymer thereof.

Examples of the monomer and the (co)polymer thereof include an unsaturated carboxylic acid (for example, acrylic acid, methacrylic acid, itaconic acid, crotonic acid, isocrotonic acid, or maleic acid), esters and amides thereof, and (co)polymers thereof. Preferable examples thereof include esters of an unsaturated carboxylic acid and an aliphatic polyhydric alcohol compound; amides of an unsaturated carboxylic acid and an aliphatic polyhydric amine compound; and (co)polymers thereof. Preferable examples thereof further include an addition product of an unsaturated carboxylic acid ester or amide having a nucleophilic substituent such as a hydroxyl group, an amino group, or a mercapto group, with a monofunctional or polyfunctional isocyanate or epoxy; a dehydration condensation product of a carboxylic acid ester or amide with a monofunctional or polyfunctional carboxylic acid. Moreover, preferable examples thereof include an addition reaction product of an unsaturated carboxylic acid ester or amide having an electrophilic substituent such as an isocyanate group or an epoxy group, with a monofunctional or polyfunctional alcohol, amine or thiol; and a substituted product of an unsaturated carboxylic acid ester or amide having a desorption substituent such as a halogen group or a tosyloxy group, with a monofunctional or polyfunctional alcohol, amine or thiol. Further, preferable examples thereof include compounds which have an unsaturated phosphonic acid, styrene or vinyl ether, instead of the unsaturated carboxylic acid of the above-described compound.

Specific examples of the monomer of the acrylic ester of the aliphatic polyhydric alcohol compound and the unsaturated carboxylic acid include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, a polyester acrylate oligomer, and isocyanuric acid EO-modified triacrylate.

Examples of the monomer of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis-[p-(methacryloxyethoxy)phenyl]dimethylmethane.

Examples of the monomer of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the monomer of the crotonic acid ester include ethylene glycol dicrotonate, tetramethylene glycol dicrotonate, pentaerythritol dicrotonate, and sorbitol tetradicrotonate.

Examples of the monomer of the isocrotonic acid ester include ethylene glycol diisocrotonate, pentaerythritol diisocrotonate, and sorbitol tetraisocrotonate.

Examples of the monomer of maleic acid ester include ethylene glycol dimalate, triethylene glycol dimalate, pentaerythritol dimalate, and sorbitol tetramaleate. Preferable examples of other esters further include aliphatic alcohol esters described in JP-B No. 51-47334 and JP-A No. 57-196231; esters having an aromatic skeleton described in JP-A Nos. 59-5240, 59-5241 and 2-226149; esters containing an amino group described in JP-A No. 1-165613. These ester monomers may be used as a mixture.

Specific examples of monomers of amides of aliphatic polyhydric amine compounds and unsaturated carboxylic acid include methylene-bis-acrylamide, methylene-bis-methacrylamide, 1,6-hexamethylene-bis-acrylamide, 1,6-hexamethylene-bis-methacrylamide, diethylenetriamine trisacrylamide, xylylene bis-acrylamide, and xylylene bis-methacrylamide. Preferable examples of amide monomers further include amide monomers having a cycloxylene structure as described in JP-B No. 54-21726.

Moreover, urethane addition polymerizable compounds obtained by addition reaction of isocyanate and a hydroxy group are preferably used. Specific examples thereof include vinyl urethane compounds containing two or more polymerizable vinyl groups per molecule in which a vinyl monomer containing a hydroxy group represented by the following Formula (A) has been added to a polyisocyanate compound having two or more isocyanate groups per molecule described in JP-B No. 48-41708.

$$CH_2=C(R^4)COOCH_2CH(R^5)OH \qquad \text{Formula (A)}$$

wherein, in Formula (A), $R^4$ and $R^5$ each independently represent H or $CH_3$.

Details of the structure and usage (such as, single use or combined use, or addition amount) of the polymerizable compounds can be appropriately determined in accordance with the final design for performance of a photosensitive resin composition. For example, in consideration of sensitivity, a structure is preferable in which the content of unsaturated groups per molecule is high. In many cases, a structure having two or more functional groups is preferable. In order to increase the strength of a cured layer, a polymerizable compound having three or more functional groups is preferable. Furthermore, it is preferable to use polymerizable compounds having a different number of functional groups and/or having a different type of polymerizable group (for example, an acrylic ester, a methacrylic acid ester, a styrene compound, and a vinyl ether compound) in combination in order to adjust both the sensitivity and strength of a cured film. The selection and the usage of polymerizable compounds are important with respect to the dispersibility and compatibility with other components contained in a photosensitive resin composition (for example, a photopolymerization initiator, a coloring material such as pigment or dye, and a binder polymer). For example, the compatibility may be increased by using a low purity compound or using two or more kinds of polymerizable compound in combination. In order to improve adhesiveness with a hard surface such as a substrate, a specific structure may also be selected.

The content of the polymerizable compound (the total contents, when two or more kinds of polymerizable compounds are used) in the photosensitive resin composition is not particularly limited. In order to obtain the effects of the invention more efficiently, the content of the polymerizable compound is preferably from 10% by mass to 80% by mass, more preferably from 15% by mass to 75% by mass, and still more preferably from 20% by mass to 60% by mass, with respect to the total solid content of the photosensitive resin composition.

Photopolymerization Initiator

The photosensitive resin composition of the invention contains at least one photopolymerization initiator. The photopolymerization initiator is not particularly limited as long as it can initiate polymerization the above-described photopolymerizable compound. The photopolymerization initiator is preferably selected based on properties, initiation efficiency, an absorption wavelength, availability, cost, or the like.

Examples of the photopolymerization initiator include at least one active halogenated compound selected from a halomethyl oxadiazole compound or a halomethyl-s-triazine compound; a 3-aryl-substituted coumarin compound, a lophine dimer, a benzophenone compound, an acetophenone compound and derivatives thereof, a cyclopentadiene-benzene-iron complex and salts thereof, and an oxime compound. Among these, in order to suppress the separation of a light-shielding color filter (specifically, suppress the separation when the light-shielding color filter is formed on a substrate having a structure), an oxime compound is preferable.

The oxime compound (hereinafter also referred to as an "oxime photopolymerization initiator") is not particularly limited. Examples thereof include oxime compounds such as those described in JP-A No. 2000-80068, WO02/100903A1, and JP-A No. 2001-233842.

Specific examples thereof include, but not limited to, 2-(O-benzoyloxime)-1-[4-(phenylthio)phenyl]-1,2-butanedione, 2-(O-benzoyloxime)-1-[4-(phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-heptanedione, 2-(O-benzoyloxime)-1-[4-(phenylthio)phenyl]-1,2-octanedione, 2-(O-benzoyloxime)-1-[4-(methylphenylthio)phenyl]-1,2-butanedione, 2-(O-benzoyloxime)-1-[4-(ethylphenylthio)phenyl]-1,2-butanedione, 2-(O-benzoyloxime)-1-[4-(butylphenylthio)phenyl]-1,2-butanedione, 1-(O-acetyloxime)-1-[9-ethyl-6-(2-methylbenzoyl)-9H-carbazol-3-yl]ethanone, 1-(O-acetyloxime)-1-[9-methyl-6-(2-methylbenzoyl)-9H-carbazol-3-yl]ethanone, 1-(O-acetyloxime)-1-[9-propyl-6-(2-methylbenzoyl)-9H-carbazol-3-yl]ethanone, 1-(O-acetyloxime)-1-[9-ethyl-6-(2-ethylbenzoyl)-9H-carbazol-3-yl]ethanone, and 1-(O-acetyloxime)-1-[9-ethyl-6-(2-butylbenzoyl)-9H-carbazol-3-yl]ethanone.

Among these, 2-(O-benzoyloxime)-1-[4-(phenylthio)phenyl]-1,2-octanedione and 1-(O-acetyloxime)-1-[9-ethyl-6-(2-methylbenzoyl)-9H-carbazol-3-yl]ethanone are preferable. Specific examples thereof include CGI-124 and CGI-242 (trade names, manufactured by Ciba Specialty Chemicals).

A sensitizer or a light stabilizer may be used in combination with the photopolymerization initiator.

In the photosensitive resin composition of present invention, in addition to the above-described photopolymerization initiator, other known initiators may be used.

The photopolymerization initiator can be used singly or in combination of two or more kinds thereof.

In order to obtain the effects of the invention more effectively, the content of the photopolymerization initiator (the total content, when two or more kinds of photopolymerization initiators are used) in the photosensitive resin composition is preferably from 3% by mass to 20% by mass, more preferably from 4% by mass to 19% by mass, and still more preferably from 5% by mass to 18% by mass, with respect to the total solid content of the photosensitive resin composition.

Other Components

The photosensitive resin composition of the invention may include least one solvent. The definitions of specific examples of the solvent are the same as those described in "Dispersion composition and production method thereof" above, and the preferable definitions are also the same as those described therein.

The photosensitive resin composition may include other components, such as a sensitizer; a co-sensitizer; an adhesion improver for increasing adhesiveness with a hard surface such as a substrate (for example, a silane coupling agent or a titanium coupling agent); or known additives such as an inorganic filler or a plasticizer for improving the physical properties of a cured film, or a fat sensitizer. If necessary, the photosensitive resin composition may include at least one of a chain transfer agent; a thermal polymerization initiator for increasing the curing degree of a film in post heating after exposure and development, such as an azo compound or a peroxide compound; a thermal polymerization component; a UV absorber; such as alkoxy benzophenone; a plasticizer such as dioctyl phthalate; an agent for increasing developability such as low molecular weight organic carboxylic acid; other fillers; high molecular weight compounds other than the above-described alkali soluble resins; various additives such as an antioxidant or an aggregation inhibitor; and polyfunctional thiol or epoxy compounds for the purpose of increasing the strength and sensitivity of a film.

Sensitizer

Preferable examples of the sensitizer include a sensitizer for increasing the sensitivity of the above-described photopolymerization initiator by an electron transfer mechanism or an energy transfer mechanism. Examples thereof include a compound that has a structure selected from the following structures and has an absorption wavelength in a wavelength region of from 300 nm to 450 nm. Examples of such structures include polynuclear aromatic compounds (for example, phenanthrene, anthracene, pyrene, perylene, triphenylene, and 9,10-dialkoxy anthracene), xanthenes, thioxanthones, cyanines, merocyanines, phthalocyanines, thiazines, acridines, anthraquinones, squaryliums, acridine orange, coumarins, keto-coumarin, phenothiazines, phenazines, styryl benzenes, azo compounds, diphenylmethane, triphenylmethane, distyryl benzenes, carbazoles, porphyrin, spiro compounds, quinacridone, indigo, styryl, pyrylium compounds, pyrromethene compounds, pyrazolotriazole compounds, benzothiazole compounds, barbituric acid derivatives, thiobarbituric acid derivatives, acetophenone, benzophenone, thioxanthone, aromatic ketone compounds such as Michler's ketone, and heterocyclic compounds such as N-aryl oxazolidinone.

The co-sensitizer has functions of further increasing the sensitivity of the photopolymerization initiator or the above-described sensitizer to active radiation, or suppressing polymerization inhibition of the photopolymerizable compound due to oxygen. Examples of the co-sensitizer include amines (triethanolamine, p-dimethylamino ethyl benzoates, p-formyldimethylaniline, and p-methylthiodimethylaniline), thiol and sulfides (for example, 2-mercaptobenzothiazole, 2-mercaptobenzooxazole, 2-mercaptobenzimidazole, 2-mercapto-4(3H)-quinazoline, and β-mercaptonaphthalene), amino acid compounds (for example, N-phenylglycine), organometallic compounds (for example, tributyltin acetate), hydrogen donors, and sulfur compounds (for example, trithiane).

Thermal Polymerization Inhibitor

By adding a thermal polymerization inhibitor, undesirable thermal polymerization of a photopolymerizable compound can be prevented during production or storage of the photosensitive resin composition. Examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine primary cerium salt. If necessary, in order to prevent the polymerization inhibition due to oxygen, higher fatty acid derivatives such as behenic acid or behenic acid amide may be added to the photosensitive resin composition to unevenly distribute on the surface of a coated film during a drying process after the application.

The amount the thermal polymerization inhibitor is preferably from about 0.01% by mass to about 5% by mass, with respect to the total mass of the photosensitive resin composition.

Surfactant

The photosensitive resin composition of to the invention may contain a surfactant, in view of improving coatability. Examples of the surfactant include a fluorinated surfactant, a nonionic surfactant, a cationic surfactant, an anionic surfactant and a silicone surfactant.

When the photosensitive resin composition includes a fluorinated surfactant, the property (in particular, fluidity) of the composition as a coating solution can be further improved, thereby improving the uniformity in coating thickness and reducing the amount of the coating solution to be used. More specifically, in the photosensitive resin composition containing a fluorinated surfactant, the interfacial tension between the coating solution and a surface of a substrate to be coated is lowered, whereby wettability onto the substrate may be improved and coatability of the composition may be improved. Therefore, a coating layer having an even thickness can be obtained with a smaller amount of the coating solution even when the thickness of the coating layer is a few micrometers.

The fluorine content of the fluorinated surfactant is preferably from 3% by mass to 40% by mass, more preferably from 5% by mass to 30% by mass, and still more preferably from 7% by mass to 25% by mass. When the fluorine content is within the above range, sufficient effects in the uniformity of the thickness of a coating layer and in reduction in the coating solution can be obtained. In addition, sufficient solubility in the composition can be obtained.

Examples of the fluorinated surfactant include MEGAFAC F171, F172, F173, F176, F177, F141, F142, F143, F144, $R^{30}$, F437, F479, F482, F780 and F781 (all trade names, manufactured by DIC Corporation); FLORARD FC430, FC431 and FC171 (all trade names, manufactured by Sumitomo 3M Ltd.); SURFLON S-382, SC-101, SC-103, SC-104, SC-105, SC-1068, SC-381, SC-383, S-393 and KH-40 (all trade names, manufactured by Asahi Glass Co., Ltd.); and CW-1 (trade name, manufactured by Zeneca Co., Ltd.).

Specific examples of the cationic surfactant include phthalocyanine derivative EFKA-745 (trade name; manufactured by EFKA Co.), organosiloxane polymer KP341 (manufactured by Shin-Etsu Chemical Co., Ltd.), (meth)acrylic acid (co)polymers POLYFLOW No. 75, 90 and 95 (trade names; manufactured by Kyoei Chemical Co., Ltd.) and W001 (trade name, manufactured by Yusho Co Ltd.).

Specific examples of the nonionic surfactant include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan aliphatic acid esters such as PLURONIC L10, L31, L61, L62, 10R5, 17R2 and 25R2, and TETRONIC 304, 701, 704, 901, 904 and 150R1 (all trade names; manufactured by BASF SE).

Specific examples of the anionic surfactant include WO04, WO05, and WO17 (trade names, manufactured by Yusho Co Ltd.).

Examples of the silicone surfactant include TORAY SILICONE DC3PA, SH7PA, DC11PA, SH21PA, SH28PA, SH29PA, SH30PA and SH8400 (trade names; manufactured by DOW CORNING TORAY SILICONE), TSF-4440, TSF-4300, TSF-4445, TSF-444(4)(5)(6)(7)6, TSF-4460 and TSF-4452 (trade names; manufactured by GE Toshiba Silicone Co., Ltd.), KP341 (trade name; manufactured by Shin-Etsu Silicone) and BYK-323 and BYK-330 (trade name; manufactured by BYK Chemie).

These surfactants may be used singly or in combination of two or more kinds thereof.

Light-Shielding Color Filter

The light-shielding color filter of the invention is formed using the above-described photosensitive resin composition of the invention. The light-shielding color filter of the invention has excellent light-shielding ability. The separation of the light-shielding color filter of the invention is suppressed since it is formed using the photosensitive resin composition of the invention with which the separation of the light-shielding color filter is suppressed when formed on a substrate having a structure.

The light-shielding color filter refers to a light-shielding pattern obtained by exposing and developing a photosensitive resin composition containing at least a black coloring material, a photopolymerizable compound, a resin, a photopolymerization initiator, and a solvent. The color of the light-shielding color filter may be an achromatic color such as black or gray, or may be black, gray, or the like with which a tint of chromatic color has been mixed. Since the light-shielding color filter is obtained by exposing and developing a photosensitive resin composition containing at least a black coloring material, a photopolymerizable compound, a resin, a photopolymerization initiator and a solvent, it may also be referred to as a light-shielding film or a light-shielding filter.

The light-shielding color filter can be preferably used for various applications such as, in a solid-state image sensor, for blocking light in portions other than a light receiving portion in a surface at which a light receiving element is formed, for blocking light on a surface opposite to the surface at which a light receiving element is formed, or for use as a pixel for adjusting color (for example, pixels of achromatic color such as black or gray, or pixels of black, gray, or the like with which chromatic colors have been mixed).

The film thickness of the light-shielding color filter is not particularly limited, and is preferably from 0.1 µm to 10 µm, more preferably from 0.3 µm to 5.0 µm, and still more preferably from 0.5 µm to 3.0 µm, in order to obtain the effects of the invention more efficiently. The pattern size of the light-shielding color filter is not particularly limited and is preferably from 1000 µm or smaller, more preferably from 500 µm or smaller, and still more preferably from 300 µm or smaller, in order to obtain the effects of the invention more efficiently. The lower limit of the pattern size is preferably 1 µm.

The spectral properties of the light-shielding color filter of the invention are not particularly limited. However, in order to increase light-shielding ability in the infrared region, which may be required when the light-shielding color filter is applied to solid-state image sensors, in consideration of the balance of the light-shielding ability between in a visible region and in an infrared region, and in order to obtain the effects of the invention more efficiently, the ratio ($OD_{1200}/OD_{365}$) of the optical density in the wavelength of 1200 nm ($OD_{1200}$) to the optical density in the wavelength of 365 nm ($OD_{365}$) is preferably from 0.5 to 3.

The optical density (OD) is determined as an OD value obtained by measuring the transmittance of the obtained film using UV-3600 (trade name, manufactured by Shimadzu Corp.), and converting the obtained transmittance (% T) by the following Equation B.

$$\text{OD value} = -\text{Log}(\%\,T/100) \qquad \text{Equation B}$$

In the invention, the optical density in a wavelength of X nm is represented by "$OD_\lambda$".

In consideration of the balance of the light-shielding ability between in a visible region and in an infrared region, and in order to obtain the effects of the invention more efficiently, preferable ranges of the optical density of the light-shielding color filter are as follows:

The ($OD_{1200}/OD_{365}$) is preferably from 1.0 to 2.5, and more preferably from 1.3 to 2.0.

The optical density of the light-shielding color filter in the wavelength of 1200 nm ($OD_{1200}$) is preferably from 1.5 to 10, and more preferably from 2 to 10.

The optical density of the light-shielding color filter in the wavelength of 365 nm ($OD_{365}$) is preferably from 1 to 7, and more preferably from 2 to 6.

The optical density of the light-shielding color filter in the wavelength region of 900 nm to 1300 nm is preferably from 2 to 10, more preferably from 2 to 9, and still more preferably from 2 to 8.

The ratio ($OD_{900}/OD_{365}$) of the light-shielding color filter is preferably from 1.0 to 2.5, and more preferably from 1.1 to 2.5.

The ratio ($OD_{1100}/OD_{365}$) of the light-shielding color filter is preferably from 0.6 to 2.5, and more preferably from 0.7 to 2.5.

The ratio ($OD_{1300}/OD_{365}$) of the light-shielding color filter is preferably from 0.4 to 2.3, and more preferably from 0.5 to 2.0.

The light-shielding color filter of the invention can be preferably used for solid-state image sensors such as CCDs or CMOSs, and more preferably used for solid-state image sensors such as CCDs or CMOSs having in excess of 1 million pixels. Specifically, the light-shielding color filter of the invention is preferably used as a thin film having a thickness of 2 μm or less (and more preferably 1 μm or less). When such a thin film is used, the relative amount of components in the film other than a coloring material that contribute to photolithographic properties decreases, while the relative amount of other components further decreases due to an increase in the amount of the coloring material for black, thereby reducing the transmission amount of light beams in the film. As a result, an inversely tapered pattern that is prone to excessive development is formed at the lower portion of a film, at which the exposure amount is reduced, or separation of the pattern becomes more likely to occur. This problem is remarkable when the thickness of the film is from 0.005 μm to 0.9 μm (and more remarkable when the thickness is 0.1 μm to 0.7 μm).

Method of Producing Light-Shielding Color Filter

A method of producing the light-shielding color filter of the present invention, the method includes: forming a photosensitive layer by applying the above-described photosensitive resin composition for a light-shielding color filter of the invention onto a substrate (hereinafter sometimes referred to as a "photosensitive layer formation process"); exposing the photosensitive layer to light patter-wise (hereinafter sometimes referred to as an "exposure process"); and forming a color pattern by developing the exposed photosensitive layer (hereinafter sometimes referred to as a "developing process").

Hereinafter, each process in the method of producing the light-shielding color filter of the invention is described.

Photosensitive Layer Formation Process

In the photosensitive layer formation process, the photosensitive layer is formed by applying the photosensitive resin composition of the invention onto a substrate.

Examples of the substrate include substrates for photoelectric conversion elements used in solid-state image sensors, such as a silicon substrate (silicon wafer) or a complementary metal oxide semiconductor (CMOS). If necessary, an undercoat layer may be provided on the substrate in order to improve the adhesion to an upper layer, prevent diffusion of substances, or flatten the substrate surface. In the light-shielding color filter of the invention and the method of producing the light-shielding color filter, when a substrate having a structure (for example, a substrate on which a pattern structure has been formed) is used as the substrate, the effect of preventing the separation by the invention may be more effectively achieved. Examples of the pattern structure include various kinds of pattern structures such as a thin film transistor, a photoelectric conversion element or a passivation film, and color patterns (for example, a red pattern, a green pattern, a blue pattern, or a transparent pattern) already prepared on the substrate prior to the formation of the light-shielding color filter.

Examples of the method of applying the photosensitive resin composition of the invention onto the substrate include various kinds of coating methods, such as a slit coating method, an inkjet method, a spin coating method, a cast coating method, a roll coating method, or a screen printing method.

The thickness of a coating film (dry film thickness) formed using the photosensitive resin composition is preferably from 0.35 μm to 3.0 μm and more preferably from 0.50 μm to 2.5 μm, from the viewpoint of resolution and developability.

The photosensitive resin composition applied onto the substrate is generally dried at a temperature of 70° C. to 130° C. for about 2 minutes to 4 minutes, thereby forming a photosensitive layer.

Exposure Process

In the exposure process, the photosensitive layer formed by the photosensitive layer formation process is cured by exposing pattern-wise, for example, through a mask (when exposing it through the mask, only an exposed area on the coating film is cured.).

It is preferable to perform the exposure by irradiation of radiation. The exposure is conducted preferably with an ultraviolet ray such as g-line, h-line, or i-line, and more preferably using a high-pressure mercury vapor lamp. The irradiation intensity is preferably from 5 mJ to 3000 mJ, more preferably from 10 mJ to 2000 mJ, and still more preferably from 10 mJ to 1000 mJ.

Development Process

Subsequent to the exposure process, a color pattern is formed by developing the exposed photosensitive layer by, for example, an alkaline development treatment. In the development process, the non-exposed area of the photosensitive layer is dissolved in an aqueous alkaline water solution or the like, whereby only an exposed area remains after the development.

The developer is preferably an organic alkali developer in that it is less likely to cause damage of a circuit or the like on the substrate. The developing temperature is generally from 20° C. to 30° C. and the developing time is generally from 20 seconds to 240 seconds.

Examples of the developer include an aqueous alkaline solution obtained by diluting an organic alkali compound with pure water to a concentration of from 0.001% by mass to 10% by mass and preferably from 0.01% by mass to 1% by mass. Examples of the organic alkali compound include ammonia water, ethylamine, diethylamine, dimethylethanolamine, tetramethylammonium hydroxide, tetraethylammonium hydroxide, choline, pyrrole, piperidine, and 1,8-diazabicyclo[5.4.0]-7-undecene. When the alkaline aqueous solution is used as the developer, washing (rinse) after development is generally performed using pure water.

If necessary, in addition to the above-described photosensitive layer formation process, exposure process and the development process, the method of producing the light-shielding color filter of the invention may include the a curing process for curing the developed pattern by heating and/or exposing.

Solid-State Image Sensor

The solid-state image sensor of the invention has the above-described light-shielding color filter of the invention. Since the solid-state image sensor of the invention has the light-shielding color filter of the invention which has excellent light-shielding ability and in which separation is suppressed, the solid-state image sensor has excellent color reproducibility with reduced noise.

The configuration of the solid-state image sensor is not particularly limited as long as it includes the light-shielding color filter of the invention and can function as a solid-state image sensor. Examples of the configuration include a configuration in which a light-receiving element (for example, a light-receiving element consisting of plural photodiodes or polysilicon), which constitutes a light-receiving portion of a solid-state image sensor (such as a CCD image sensor or a CMOS image sensor), is formed on a substrate and the light-shielding color filter of the invention is formed on a surface of the substrate on which a light receiving element is formed (for example, on an area other than the light-receiving portion or on a pixel area for adjusting color) or on a surface of the substrate opposite to the side at which the light receiving element is formed.

EXAMPLES

Hereinafter, the present invention is described in detail with reference to Examples, but the present invention is not limited to the Examples without departing from the scope of the present invention. In the following description, "part" and "%" are based on mass unless otherwise specified.

Synthesis of Dispersant

Synthesis of Dispersant 1

Into a 500 mL three-neck flask, 600.0 g of ε-caprolactone and 22.8 g of 2-ethyl-1-hexanol were added, and then stirred and dissolved while blowing a nitrogen gas. 0.1 g of monobutyltin oxide was added thereto, and the mixture was heated to 100° C. The disappearance of the raw materials was confirmed using a gas chromatography method 8 hours after heating, and then the resultant was cooled to 80° C. 0.1 g of 2,6-di-tert-butyl-4-methylphenol was added thereto, and then 27.2 g of 2-(methacryloyloxy)ethyl isocyanate was added. After 5 hours, the disappearance of the raw materials was confirmed by $^1$H-NMR spectra, and then the resultant was cooled to room temperature, thereby obtaining 200 g of a solid precursor compound M1 (having the following structure). M1 was confirmed by $^1$H-NMR, IR, and mass analysis.

M1

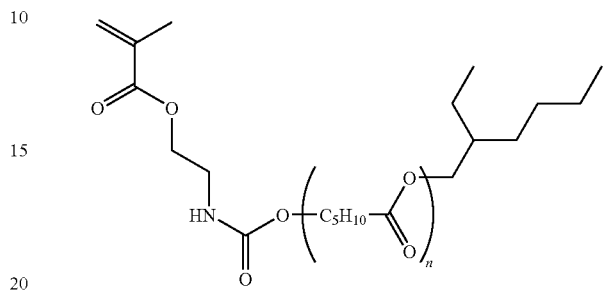

Into a three-neck flask, 30.0 g of the precursor compound M1, 70.0 g of NK ester CB-1, 2.3 g of dodecyl mercaptan, and 233.3 g of propylene glycol monomethyl ether acetate were added, and then the air therein was replaced with nitrogen gas. The mixture was stirred using an agitator (trade name: THREE-ONE MOTOR, manufactured by Shinto Scientific Co., Ltd.), and then heated to 75° C. while introducing nitrogen gas into the flask. To the resultant, 0.2 g of dimethyl 2,2-azobis(2-methylpropionate) (trade name: V-601, manufactured by Wako Pure Chemical Ind. Ltd.) was added, and the mixture was stirred at 75° C. for 2 hours. Thereafter, 0.2 g of V-601 was further added, and the mixture was stirred at 75° C. for 3 hours, thereby obtaining a 30% liquid of the following Dispersant 1.

The composition ratio, the acid value, and the weight average molecular weight (Mw) of Dispersant 1 are shown in Table 1. The weight average molecular weight is a value in terms of polystyrene equivalents, as measured by a gel permeation chromatography (GPC). The GPC was measured using HLC-8020GPC (trade name, manufactured by Tosoh Corporation) using columns of TSKgel SuperHZM-H, TSKgel SuperHZ4000, and TSKgel SuperHZ200 (all trade names, manufactured by Tosoh Corporation company).

Synthesis of Dispersants 2 to 5 and Comparative Resins 1 and 2

Each of the following Dispersants 2 to 5 and Comparative Resins 1 and 2 was synthesized using the same method as the synthesis of Dispersant 1. The composition ratio, the acid value, and the weight average molecular weight (Mw) of Dispersants 2 to 5 and Comparative Resins 1 and 2 are shown in Table 1.

Dispersant 1

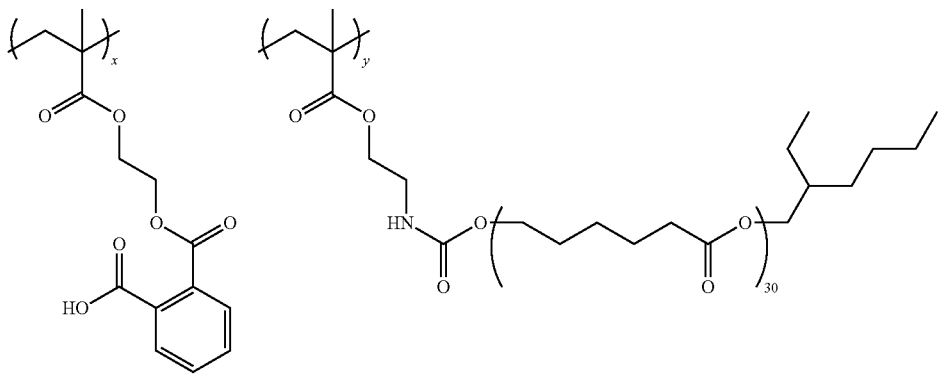

-continued
Dispersant 2
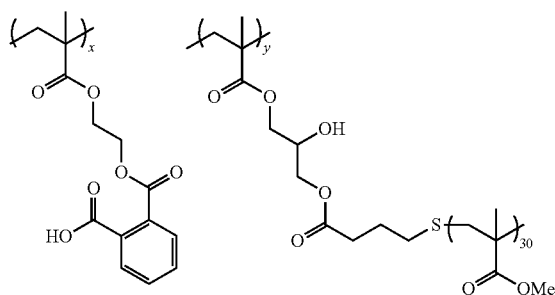
Dispersant 3
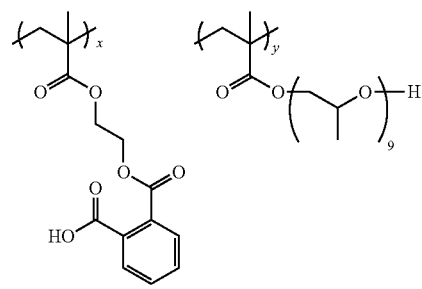
Dispersant 4
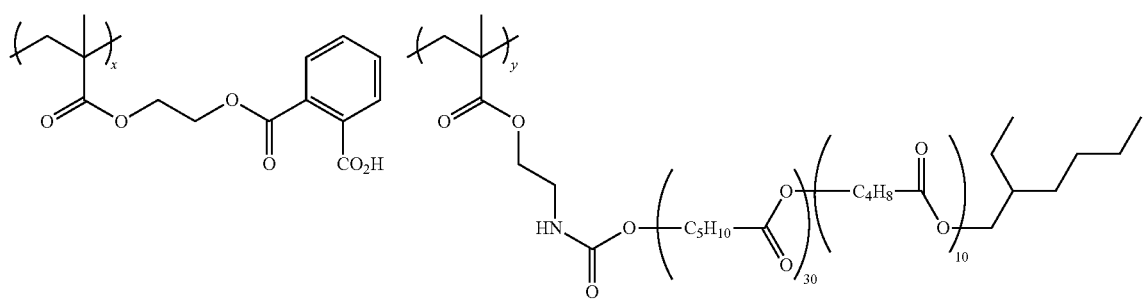
Dispersant 5
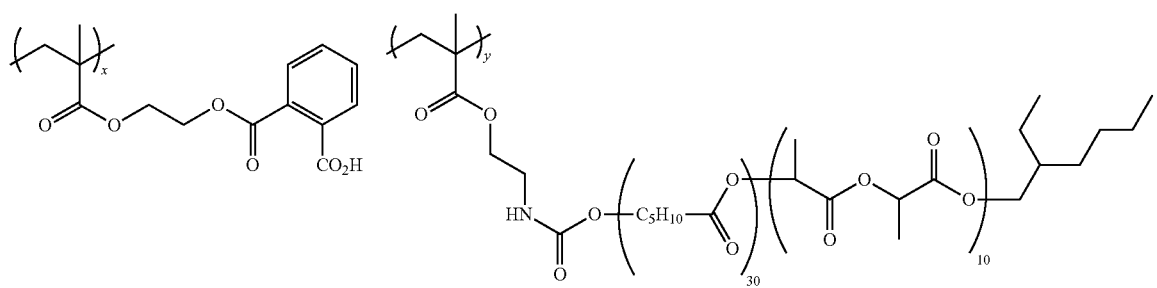
Dispersant 6
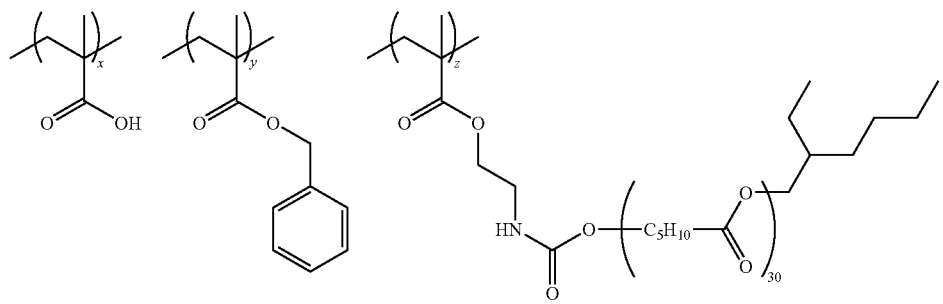
Comparative Resin 1
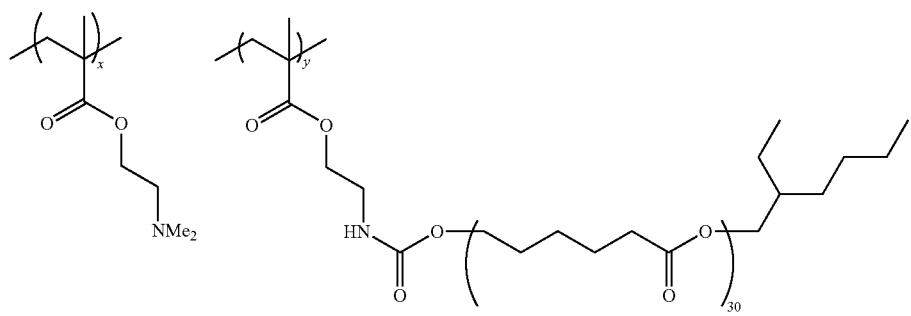

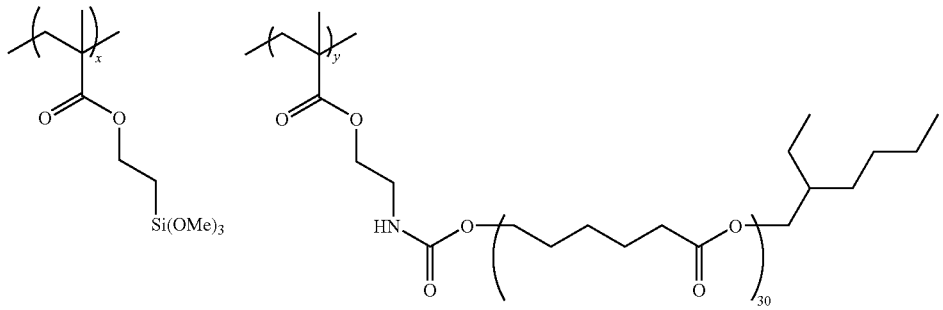

Comparative Resin 2

Example 1

Preparation of Titanium Black Dispersion Liquid

Components of the following formation were mixed and the mixture was dispersed using a bead mill, thereby obtaining a dispersion liquid.
Composition:

| | |
|---|---|
| Titanium black (trade name: 13 M-T, manufactured by MITSUBISHI MATERIALS) | 29.4 parts |
| The above-described Dispersant 1 | 26.5 parts |
| Propylene glycol monomethyl ether acetate (solvent) | 44.1 parts |

The prepared dispersion liquid was dispersed using an ULTRA APEX MILL UAM-015 (trade name, manufactured by Kotobuki Industries Co., Ltd) under the following conditions.
Dispersion Conditions:
  Bead diameter: φ0.05 mm
  Bead filling volume: 75% by volume
  Mill rotational speed: 12 msec
  Amount of mixed liquid to be dispersed: 680 g
  Circulation rate (pump feed rate): 13 kg/hour
  Temperature of treatment liquid: 25° C. to 30° C.
  Cooling water: tap water
  Internal volume of annular passage of bead mill: 0.15 L After the dispersion was initiated, the viscosity (at 25° C.) of the dispersion liquid was measured by a viscometer RE-85 (trade name, manufactured by Toki Sangyo Co., Ltd.) every one pass of treatment (every 30 minutes) while performing dispersion treatment under the above-described conditions. In this case, the viscosity decreased with dispersion time (with the number of passes), and the amount of change of the viscosity gradually increased. At the time when the change in the viscosity reached 5 mPa·s or more while the dispersion was further continued (that is, when the change in the viscosity reached 5 mPa·s/pass or more), 120 g of a liquid of Dispersant 1 in propylene glycol monomethyl ether acetate (shown below) was added to the dispersion liquid.

Separately, the volume average particle diameter of the dispersion liquid was also measured every one pass of treatment. In this case, the volume average particle diameter decreased with the dispersion time (with the number of passes), and the amount of change of the volume average particle diameter gradually decreased. Then, at the time when the change in the volume average particle diameter per pass reached 10 mPa·s or less while the dispersion was further continued (that is, when the change in the viscosity reached 10 mPa·s/pass or less), 120 g of a liquid of Dispersant 1 in propylene glycol monomethyl ether acetate (shown below) was added to the dispersion liquid.
Composition of Liquid:

| | |
|---|---|
| The above-described Dispersant 1 | 30 parts |
| Propylene glycol monomethyl ether acetate | 70 parts |

After the liquid (dispersant) was added, 10 passes of dispersion treatment were further continued. Then, the time when the change in the viscosity per pass reached 5 mPa·s or more again, or the change in the volume average particle diameter per pass reached 10 nm or less again, was defined as the time of completion of titanium black dispersion liquid.

In this manner, a titanium black dispersion liquid was prepared. The ratio (D/P; mass ratio) of the amount of the dispersant to the amount of the titanium black of the obtained titanium black dispersion liquid was 0.45.

Evaluation 1

Aggregation Test

Aggregation test was conducted to evaluate aggregation properties of the obtained titanium black dispersion liquids.

The aggregation properties of titanium black were evaluated by determining the concentration of the solid content of the dispersion liquid before and after passage of a given period of time.

More specifically, 1 g of the dispersion liquid was weighed and heated in an oven at 165° C. for 60 minutes, and then the concentration of the solid content is determined by measuring the amount of the dispersion liquid after heating. Then, the amount of solid content was calculated by the following equation:

Amount of solid content (mass %)=(Amount of dispersion liquid after heating/Amount of dispersion liquid before heating)×100.

In order to measure the solid content after passage of a given time, the titanium black dispersion liquid was put into a 50 mL resin container and then allowed to stand at room temperature or at −5° C. (cold storage) for six months. Then, 5 g of supernatant of respective stored titanium black dispersion liquids was collected from the surface of the liquid to a depth of 1 cm, thereby determining the amount of the solid content. The evaluation results are shown in Table 1.
Evaluation Criteria
A: The amount of change of solid content was less than 3%.
B: The amount of change of solid content was 3% or more and less than 10%.
C: The amount of change of solid content was 10% or more.

As shown in Table 1, in the dispersion liquids of the Examples, the aggregation of the titanium black was suppressed. In the Examples, the effect of improving the aggregation stability was exhibited when prepared by using a dispersant having an acid value of 50 mgKOH/g or more and by adding the dispersant in batches (multistage dispersion treatment).

Preparation of Photosensitive Resin Composition

The components of the following composition were mixed to obtain a photosensitive resin composition.

Photosensitive Resin Composition

| | |
|---|---|
| Titanium black dispersion liquid prepared above | 50 parts |
| (Titanium black dispersion liquid prepared based on the change in the viscosity) | |
| Dipentaerythritol hexaacrylate (T-1; shown below) | 8 parts |
| Oxime photopolymerization initiator (K-1; shown below) | 5 parts |
| Resin (J-1; shown below) (The weight average molecular weight (Mw) is shown below.) | 10 parts |
| Propylene glycol monomethyl ether acetate | 27 parts |

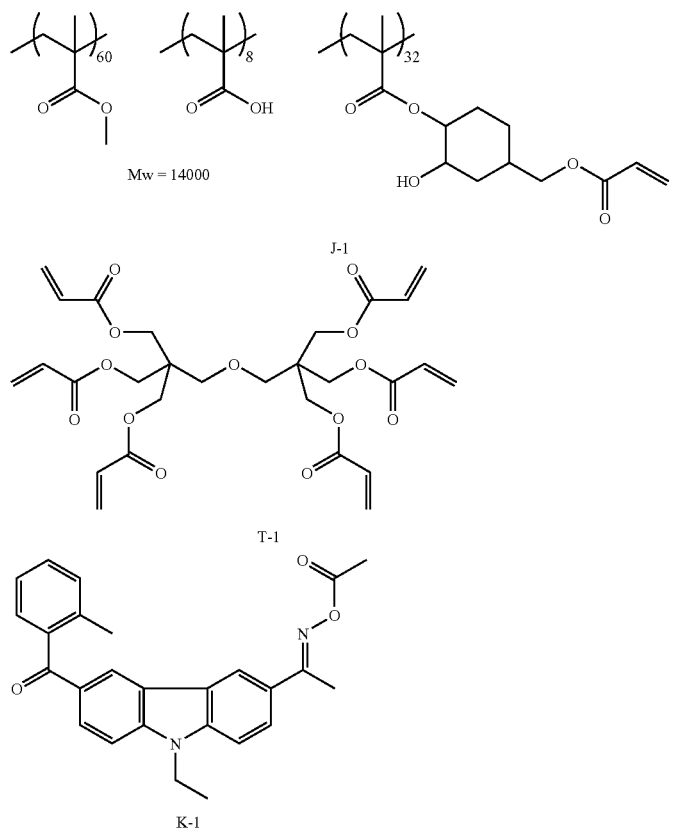

Evaluation 2

Stability Over Time

The photosensitive resin composition prepared as above was applied onto a glass substrate by a spin coating method, and then the resultant was heated on a hot plate at 120° C. for 2 minutes, thereby obtaining a photosensitive layer. Subsequently, the photosensitive layer was exposed to light independently with an exposure amount of 50 mJ/cm² or 200 mJ/cm² using an i-line stepper, thereby obtaining a light-shielding film. The absorbance of the obtained light-shielding film at the wavelength of 550 nm was measured by a spectrometer UV3600 (trade name, manufactured by Shimadzu Corp.), and the obtained absorbance was defined as Absorbance (i). Separately, the photosensitive resin composition prepared as above was put into a 100 mL glass container and sealed, and then allowed to stand at room temperature for 6 months. Thereafter, the photosensitive resin composition from the liquid surface to a depth of 2 cm was sampled. A light-shielding film was formed using the sampled photosensitive resin composition in a manner similar to that descried above. The absorbance of the light-shielding film was measured, and the obtained absorbance was defined as Absorbance (ii). The changes in the absorbances before and after the 6 months storage of the photosensitive resin composition were determined based on Absorbance (i) Absorbance and (ii), and the stability over time (storage stability) was evaluated in accordance with the following evaluation criteria.

Evaluation Criteria

A: The amount of change of absorbance was less than 3%.

B: The amount of change of absorbance was 3% or more and less than 10%.

C: The amount of change of absorbance was 10% or more.

Production of Light-Shielding Color Filter

Production of Substrate Having Patterned Structure

Onto a commercially available 6 inch silicon wafer, SR7200 (trade name, manufactured by Hitachi Chemical Co., Ltd.) was applied to form a coating film. The obtained coating film was exposed pattern-wise, and then developed and heated at 200° C. for 30 minutes, thereby forming a patterned structure. That is, the substrate having a patterned structure on which pattern structures having a height of 15 µm with a pattern size of 300 µm×300 µm were orderly arranged was obtained.

Production of Light-Shielding Color Filter

The photosensitive resin composition obtained as above was applied by a spin coating method onto the surface of the substrate on which a patterned structure was formed, and then the resultant configuration was heated on a hot plate at 120° C. for 2 minutes, thereby obtaining a photosensitive layer. Subsequently, the photosensitive layer was exposed to light independently at an exposure amount of 50 mJ/cm$^2$ or 200 mJ/cm$^2$ using an i-line stepper in such a manner that the pattern to be formed corresponded with the patterned structure produced as above (that is, in such a manner that the size of the pattern to be formed was the same as that of the patterned structure produced as above). The exposed light-shielding film was subjected to paddle development using a 0.3% aqueous tetramethylammonium hydroxide solution at 23° C. for 60 seconds. Thereafter, the resultant was rinsed with a spin shower, and then washed with pure water, thereby obtaining a light-shielding color filter having a film thickness of 2.0 µm. The light-shielding color filter was formed on the patterned structure. More specifically, the light-shielding color filter was layered on the patterned structure by matching the size of the light-shielding color filter with that of the patterned structure and by forming the light-shielding color filter at the same position as that of the patterned structure.

Evaluation 3

Separation

The presence of the separation of the light-shielding color filter obtained as above was observed under an optical microscope (×1000 magnification), and was evaluated in accordance with the following evaluation criteria. The evaluation results are shown in Table 1.

Evaluation Criteria

A: No separation was observed in the area formed by exposure at 50 mJ/cm$^2$.

B: Separation was observed in the area formed by exposure at 50 mJ/cm$^2$, but no separation was observed in the area formed by exposure at 200 mJ/cm$^2$.

C: Separation was observed in both the area formed by exposure at 50 mJ/cm$^2$ and the area formed by exposure at 200 mJ/cm$^2$.

Examples 2 to 8 and Comparative Examples 1 to 9

Each of titanium black dispersion liquids, photosensitive resin compositions and light-shielding color filters of Examples 2 to 7 and Comparative Examples 1 to 9 was prepared in the same manner as in Example 1, except that the dispersant 1 used in the "Preparation of titanium black dispersion liquid" was displaced by each of the dispersants shown in Table 1 and the batch addition process of the dispersant (multistage dispersion treatment) was changed as shown in Table 1. Then, evaluation was performed in the same manner as in Example 1. The evaluation results are shown in Table 1.

TABLE 1

| | Dispersant | | | | | | |
|---|---|---|---|---|---|---|---|
| | | Composition ratio | | | Acid value | | |
| | Structure | X (%) | Y (%) | Z (%) | (mgKOH/g) | Mw | Batch addition |
| Example 1 | Dispersant 1 | 35 | 65 | — | 80 | 31000 | Yes |
| Example 2 | Dispersant 1 | 60 | 40 | — | 120 | 31000 | Yes |
| Example 3 | Dispersant 1 | 70 | 30 | — | 140 | 31000 | Yes |
| Example 4 | Dispersant 2 | 50 | 50 | — | 100 | 32500 | Yes |
| Example 5 | Dispersant 3 | 50 | 50 | — | 100 | 31700 | Yes |
| Example 6 | Dispersant 4 | 50 | 50 | — | 100 | 34000 | Yes |
| Example 7 | Dispersant 5 | 50 | 50 | — | 100 | 33100 | Yes |
| Example 8 | Dispersant 6 | 15 | 35 | 50 | 98 | 30000 | Yes |
| Comparative Example 1 | Dispersant 1 | 35 | 65 | — | 80 | 31000 | No |
| Comparative Example 2 | Dispersant 1 | 60 | 40 | — | 120 | 31000 | No |
| Comparative Example 3 | Dispersant 1 | 70 | 30 | — | 140 | 31000 | No |
| Comparative Example 4 | Dispersant 2 | 50 | 50 | — | 100 | 32500 | No |
| Comparative Example 5 | Dispersant 3 | 50 | 50 | — | 100 | 31700 | No |
| Comparative Example 6 | Dispersant 4 | 50 | 50 | — | 100 | 34000 | No |
| Comparative Example 7 | Dispersant 5 | 50 | 50 | — | 100 | 33100 | No |
| Comparative Example 8 | Comparative resin 1 | 25 | 75 | — | 0 | 34200 | Yes |
| Comparative Example 9 | Comparative resin 2 | 20 | 80 | — | 0 | 28900 | Yes |

| | Evaluation | | | | | |
|---|---|---|---|---|---|---|
| | Aggregation test (Based on the measurement of the solid content concentration) | | | | | |
| | Change over time at room temperature (%) | | Change over time at −5° C. (%) | | Stability of composition over time | Separation |
| Example 1 | 2.1 | A | 1.4 | A | A | A |
| Example 2 | 2.4 | A | 1.7 | A | A | A |
| Example 3 | 3.1 | B | 2.1 | A | A | A |
| Example 4 | 3.5 | B | 2.2 | A | A | A |
| Example 5 | 3.1 | B | 2.0 | A | A | A |
| Example 6 | 3.2 | B | 1.9 | A | A | A |
| Example 7 | 4.0 | B | 2.4 | A | A | A |
| Example 8 | 2.8 | A | 2.0 | A | A | A |

TABLE 1-continued

| | | | | | | | |
|---|---|---|---|---|---|---|---|
| Comparative Example 1 | 19.0 | C | 12.5 | C | B | C | |
| Comparative Example 2 | 16.5 | C | 10.5 | C | B | C | |
| Comparative Example 3 | 13.4 | C | 8.7 | B | B | C | |
| Comparative Example 4 | 15.4 | C | 10.5 | C | B | C | |
| Comparative Example 5 | 12.1 | C | 8.9 | B | B | C | |
| Comparative Example 6 | 18.3 | C | 12.4 | C | B | C | |
| Comparative Example 7 | 11.2 | C | 10.0 | C | B | C | |
| Comparative Example 8 | 30.5 | C | 22.3 | C | C | C | |
| Comparative Example 9 | 32.2 | C | 24.5 | C | C | C | |

Example 9

Preparation of Titanium Black Dispersion Liquid

Components of the following formation were mixed and the mixture was dispersed using a bead mill, thereby obtaining a dispersion liquid.
Composition:

| | |
|---|---|
| Titanium black (trade name: 13 M-T, manufactured by MITSUBISHI MATERIALS) | 29.4 parts |
| The above-described Dispersant 1 | 26.5 parts |
| Propylene glycol monomethyl ether acetate (solvent) | 44.1 parts |

The prepared dispersion liquid was dispersed using an ULTRA APEX MILL UAM-015 (trade name, manufactured by Kotobuki Industries Co., Ltd) under the following conditions.
Dispersion Conditions:
  Bead diameter: 40.05 mm
  Bead filling volume: 75% by volume
  Mill rotational speed: 12 msec
  Amount of mixed liquid to be dispersed: 680 g
  Circulation rate (pump feed rate): 13 kg/hour
  Temperature of treatment liquid: 25° C. to 30° C.
  Cooling water: tap water
  Internal volume of annular passage of bead mill: 0.15 L After the dispersion was initiated, the viscosity (at 25° C.) of the dispersion liquid was measured by a viscometer RE-85 (trade name, manufactured by Toki Sangyo Co., Ltd.) every one pass of treatment (every 30 minutes) while performing dispersion treatment under the above-described conditions. In this case, the viscosity decreased with dispersion time (with the number of passes), and the amount of change of the viscosity gradually increased. At the time when the change in the viscosity reached 5 mPa·s or more while the dispersion was further continued (that is, when the change in the viscosity reached 5 mPa·s/pass or more), 120 g of a liquid of Dispersant 2 in propylene glycol monomethyl ether acetate (shown below) was added to the dispersion liquid.

Separately, the volume average particle diameter of the dispersion liquid was also measured every one pass of treatment. In this case, the volume average particle diameter decreased with the dispersion time (with the number of passes), and the amount of change of the volume average particle diameter gradually decreased. Then, at the time when the change in the volume average particle diameter per pass reached 10 mPa·s or less while the dispersion was further continued (that is, when the change in the viscosity reached 10 mPa·s/pass or less), 120 g of a liquid of Dispersant 2 in propylene glycol monomethyl ether acetate (shown below) was added to the dispersion liquid.
Composition of Liquid:

| | |
|---|---|
| The above-described Dispersant 2 | 30 parts |
| Propylene glycol monomethyl ether acetate | 70 parts |

After the liquid (dispersant) was added, 10 passes of dispersion treatment were further continued. Then, the time when the change in the viscosity per pass reached 5 mPa·s or more again, or the change in the volume average particle diameter per pass reached 10 nm or less again, was defined as the time of completion of titanium black dispersion liquid.

In this manner, a titanium black dispersion liquid was prepared. The ratio (D/P; mass ratio) of the amount of the dispersant to the amount of the titanium black of the obtained titanium black dispersion liquid was 0.45.

Examples 10 to 12

Each of titanium black dispersion liquids, photosensitive resin compositions and light-shielding color filters of Examples 10 to 12 was prepared in the same manner as in Example 9, except that the dispersant used in the "Preparation of titanium black dispersion liquid" was displaced by each of the dispersants shown in Table 2 and the batch addition process of the dispersant (multistage dispersion treatment) was conducted as shown in Table 2. Then, evaluation was performed in the same manner as in Example 1. The evaluation results are shown in Table 2.

TABLE 2

| | First Dispersant | | | | | | Second Dispersant | | | | | |
|---|---|---|---|---|---|---|---|---|---|---|---|---|
| | | Composition ratio | | | Acid value | | | Composition ratio | | | Acid value | |
| | Structure | X (%) | Y (%) | Z (%) | (mgKOH/g) | Mw | Structure | X (%) | Y (%) | Z (%) | (mgKOH/g) | Mw |
| Ex. 9 | Dispersant 1 | 35 | 65 | — | 80 | 31000 | Dispersant 2 | 50 | 50 | — | 100 | 32500 |
| Ex. 10 | Dispersant 1 | 35 | 65 | — | 80 | 31000 | Comparative Dispersant 1 | 25 | 75 | — | 0 | 34200 |
| Ex. 11 | Dispersant 3 | 50 | 50 | — | 100 | 31700 | Comparative Dispersant 2 | 20 | 80 | — | 0 | 28900 |
| Ex. 12 | Dispersant 6 | 15 | 35 | 50 | 98 | 30000 | Comparative Dispersant 1 | 25 | 75 | — | 0 | 34200 |

TABLE 2-continued

| | Evaluation | | | | | |
|---|---|---|---|---|---|---|
| | Aggregation test (Based on the measurement of the solid content concentration) | | | | | |
| | Change over time at room temperature (%) | | Change over time at −5° C. (%) | | Stability of composition over time | Separation |
| Ex. 9 | 2.1 | A | 1.9 | A | A | A |
| Ex. 10 | 1.9 | A | 0.8 | A | A | A |
| Ex. 11 | 2.1 | A | 0.6 | A | A | A |
| Ex. 12 | 2.2 | A | 2.0 | A | A | A |

Ex.: Example

As shown in Tables 1 and 2, in the Examples, the photosensitive resin compositions using the titanium black dispersion liquid exhibit excellent storage stability over time, and the separation of the light-shielding color filters formed with the photosensitive resin compositions was reduced.

According to the present invention, a dispersion composition having excellent dispersion stability in which aggregation of titanium black particles is suppressed and a method of producing the dispersion composition are provided.

The present invention also provides a photosensitive resin composition for a light-shielding color filter with which a light-shielding color filter having excellent light-shielding ability can be produced and separation of the light-shielding color filter can be prevented even when formed on a substrate having a structure, and provides a method of producing the photosensitive resin composition.

The present invention further provides a light-shielding color filter having excellent light-shielding ability with which separation is suppressed, and a method of producing the light-shielding color filter.

In addition, the present invention provides a solid-state image sensor having excellent color reproducibility with reduced noise.

All publications, patent applications, and technical standards mentioned in this specification are herein incorporated by reference to the same extent as if each individual publication, patent application, or technical standard was specifically and individually indicated to be incorporated by reference.

What is claimed is:

1. A method of producing a dispersion composition comprising titanium black, a solvent and a dispersant including at least a first dispersant and a second dispersant, the method comprising:
    dispersing a mixed liquid containing the titanium black, the first dispersant and the solvent using a bead mill; and
    adding the second dispersant to the dispersed mixed liquid and dispersing the same using a bead mill,
    wherein at least a part of the dispersant has an acid value of 50 mgKOH/g or more, and
    wherein the first dispersant and the second dispersant are the same as or different from each other, and
    wherein each of the first dispersant and the second dispersant is a graft copolymer comprising at least one selected from the group consisting of structural units represented by the following Formulae (1) to (5):

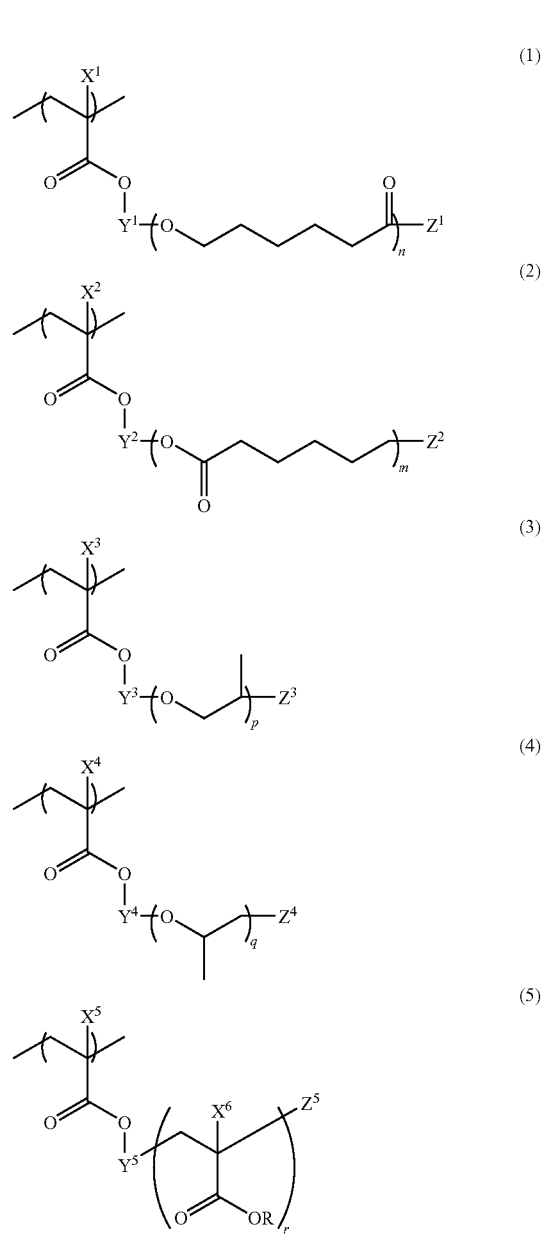

wherein, in Formulae (1) to (5), each of $X^1, X^2, X^3, X^4, X^5$, and $X^6$ independently represents a hydrogen atom or a monovalent organic group; each of $Y^1, Y^2, Y^3, Y^4$, and $Y^5$ independently represents a divalent linking group; each of $Z^1, Z^2$, and $Z^5$ independently represents a hydrogen atom or a monovalent organic group; each of $Z^3$ and $Z^4$ independently represents a hydrogen atom or an alkyl group having 5 to 24 carbon atoms; and each of n, m, p, q, and r independently represents an integer from 1 to 500.

2. The method of producing a dispersion composition according to claim 1, wherein a ratio (D/P) (mass ratio) of a total amount of the dispersant that includes at least the first dispersant and the second dispersant (D) to an amount of the titanium black (P) is from 0.2 to 1.2.

3. The method of producing a dispersion composition according to claim 1, wherein the graft chain of the graft copolymer has a total number of atoms, other than hydrogen atoms, of from 40 to 10,000.

4. A dispersion composition produced according to the method of claim 1.

5. The method of producing a dispersion composition according to claim 1, wherein each of $Z^1$, $Z^2$, and $Z^5$ independently represents a hydrogen atom, an alkyl group having 5 to 24 carbon atoms, a hydroxyl group, an alkoxyl group, an aryloxy group, a heteroaryloxy group, an alkylthio ether group, an arylthio ether group, a hetero arylthioether group, or an amino group.

6. The method of producing a dispersion composition according to claim 1, wherein each of $Z^1$, $Z^2$, $Z^3$, $Z^4$, and $Z^5$ independently represents a hydrogen atom or an alkyl group having 5 to 24 carbon atoms.

7. The method of producing a dispersion composition according to claim 1, wherein each of $Z^1$, $Z^2$, $Z^3$, $Z^4$, and $Z^5$ independently represents a branched alkyl group having 5 to 24 carbon atoms or a cyclic alkyl group having 5 to 24 carbon atoms.

8. The method of producing a dispersion composition according to claim 1, wherein each of $Y^1$, $Y^2$, $Y^3$, $Y^4$, and $Y^5$ independently represents a divalent linking group selected from the group consisting of (Y-1) to (Y-20):

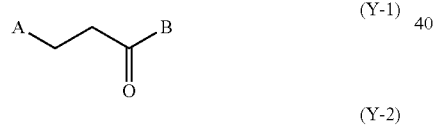
(Y-1)

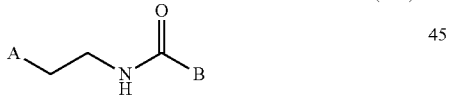
(Y-2)

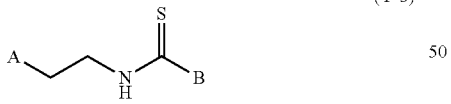
(Y-3)

(Y-4)
(Y-5)
(Y-6)

(Y-7)

(Y-8)

(Y-9)

-continued

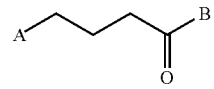
(Y-10)

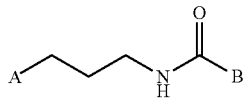
(Y-11)

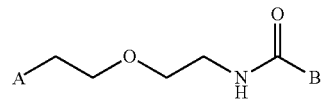
(Y-12)

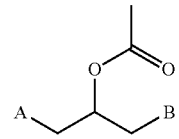
(Y-13)

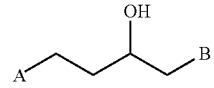
(Y-14)

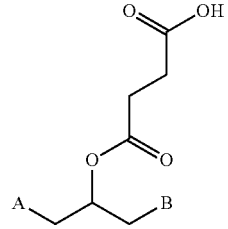
(Y-15)

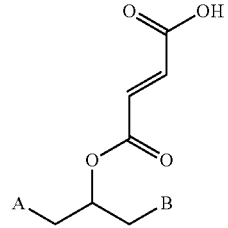
(Y-16)

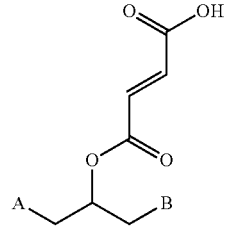
(Y-17)

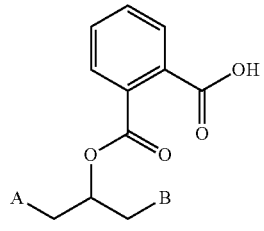
(Y-18)

-continued (Y-19)
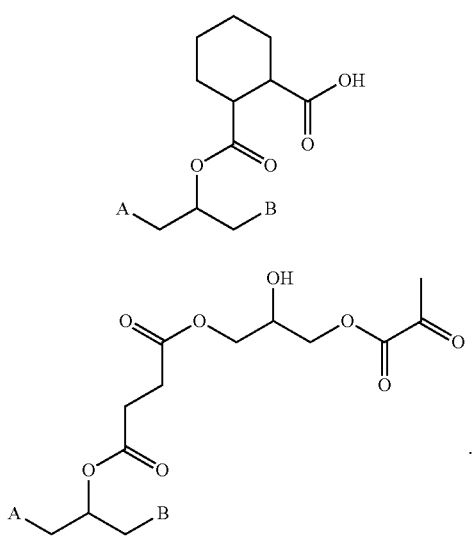

(Y-20)

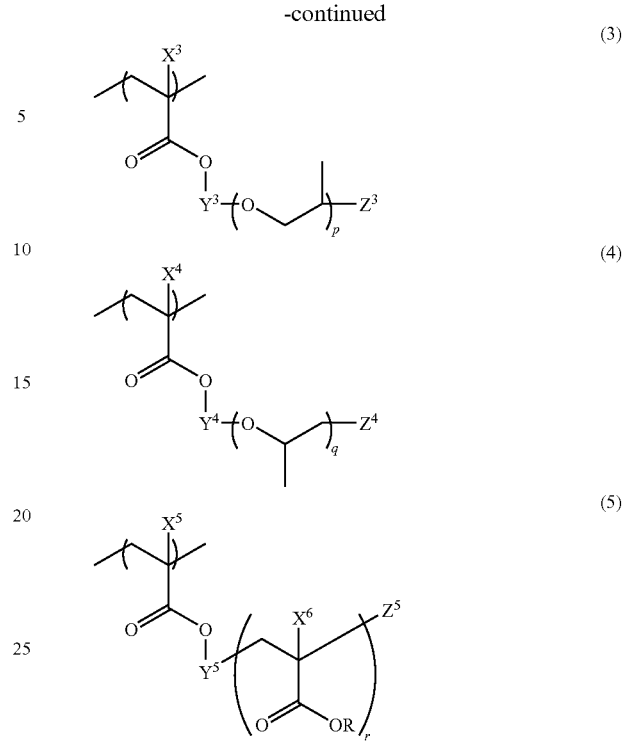

wherein, in Formulae (1) to (5), each of $X^1$, $X^2$, $X^3$, $X^4$, $X^5$, and $X^6$ independently represents a hydrogen atom or a monovalent organic group; each of $Y^1$, $Y^2$, $Y^3$, $Y^4$, and $Y^5$ independently represents a divalent linking group; each of $Z^1$, $Z^2$, and $Z^5$ independently represents a hydrogen atom or a monovalent organic group; each of $Z^3$ and $Z^4$ independently represents a hydrogen atom or an alkyl group having 5 to 24 carbon atoms; and each of n, m, p, q, and r independently represents an integer from 1 to 500.

9. A method of producing a photosensitive resin composition for a light-shielding color filter comprising titanium black, a resin, a polymerizable compound, a photopolymerization initiator, a solvent and a dispersant including at least a first dispersant and a second dispersant, the method comprising:
dispersing a mixed liquid containing the titanium black, the first dispersant and the solvent using a bead mill; and
adding the second dispersant to the dispersed mixed liquid and dispersing the same using a bead mill,
wherein at least a part of the dispersant is a dispersant having an acid value of 50 mgKOH/g or more, and
wherein the first dispersant and the second dispersant are the same as or different from each other, and
wherein each of the first dispersant and the second dispersant is a graft copolymer comprising at least one selected from the group consisting of structural units represented by the following Formulae (1) to (5):

(1)
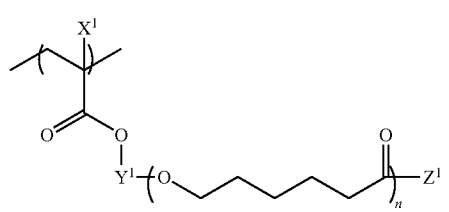

(2)
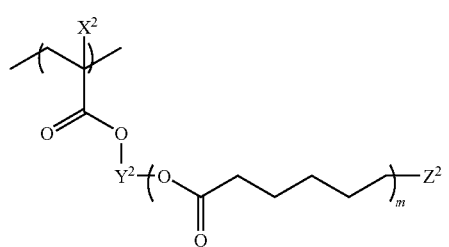

10. The method of producing a photosensitive resin composition for a light-shielding color filter according to claim 9, wherein a ratio (D/P) (mass ratio) of a total amount of the dispersant that includes at least the first dispersant and the second dispersant (D) to an amount of the titanium black (P) is from 0.2 to 1.2.

11. The method of producing a photosensitive resin composition for a light-shielding color filter according to claim 9, wherein the graft chain of the graft copolymer has a total number of atoms, other than hydrogen atoms, of from 40 to 10,000.

12. A photosensitive resin composition for a light-shielding color filter produced according to the method of claim 9.

13. A method of using the photosensitive resin composition for a light-shielding color filter according to claim 12, the method comprising producing a color filter for a solid-state image sensor, wherein the color filter includes the photosensitive resin composition.

14. A method of producing a light-shielding color filter, the method comprising:
forming a photosensitive layer by applying the photosensitive resin composition for a light-shielding color filter according to claim 12 onto a substrate;
exposing the photosensitive layer pattern-wise; and
forming a color pattern by developing the photosensitive layer.

15. A light-shielding color filter obtained according to the method of claim 14.

16. A solid-state image sensor, comprising the light-shielding color filter according to claim 15.

* * * * *